United States Patent
Suzuki et al.

(10) Patent No.: US 9,893,303 B2
(45) Date of Patent: Feb. 13, 2018

(54) LIGHT-EMITTING ELEMENT, LIGHT-EMITTING DEVICE, ELECTRONIC APPLIANCE, AND LIGHTING DEVICE

(71) Applicant: Semiconductor Energy Laboratory Co., Ltd., Kanagawa-ken (JP)

(72) Inventors: Tsunenori Suzuki, Kanagawa (JP); Naoaki Hashimoto, Kanagawa (JP); Eriko Saijo, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 152 days.

(21) Appl. No.: 14/226,360

(22) Filed: Mar. 26, 2014

(65) Prior Publication Data

US 2014/0291647 A1 Oct. 2, 2014

(30) Foreign Application Priority Data

Mar. 27, 2013 (JP) .................................. 2013-065394

(51) Int. Cl.
*H01L 51/52* (2006.01)
*H01L 51/54* (2006.01)
(Continued)

(52) U.S. Cl.
CPC ........ *H01L 51/0085* (2013.01); *H01L 51/504* (2013.01); *H01L 51/5012* (2013.01);
(Continued)

(58) Field of Classification Search
CPC ..... H01L 2251/5376; H01L 2251/5384; H01L 2251/552; H01L 51/0085; H01L 51/5012; H01L 51/5016; H01L 51/5072
See application file for complete search history.

(56) References Cited

U.S. PATENT DOCUMENTS 7,339,559 B2   3/2008  Yokoyama
7,436,113 B2  10/2008  Spindler
(Continued)

FOREIGN PATENT DOCUMENTS

CN   101604703 A   12/2009
CN   102208433 A   10/2011
(Continued)

OTHER PUBLICATIONS

International Search Report re Application No. PCT/JP2013/079334, dated Feb. 10, 2014.
(Continued)

*Primary Examiner* — Raj R Gupta
(74) *Attorney, Agent, or Firm* — Husch Blackwell LLP

(57) ABSTRACT

A light-emitting element which includes a plurality of light-emitting layers between a pair of electrodes and has low driving voltage and high emission efficiency is provided. A light-emitting element including first to third light-emitting layers between a cathode and an anode is provided. The first light-emitting layer includes a first phosphorescent material and a first electron-transport material; the second light-emitting layer includes a second phosphorescent material and a second electron-transport material; the third light-emitting layer includes a fluorescent material and a third electron-transport material; the first to third light-emitting elements are provided in contact with an electron-transport layer positioned on a cathode side; and a triplet excitation energy level of a material included in the electron-transport layer is lower than triplet excitation energy levels of the first electron-transport material and the second electron-transport material.

13 Claims, 19 Drawing Sheets

(51) Int. Cl.
*H01L 51/00* (2006.01)
*H01L 51/50* (2006.01)

(52) U.S. Cl.
CPC ...... *H01L 51/5016* (2013.01); *H01L 51/5072* (2013.01); *H01L 51/006* (2013.01); *H01L 51/0054* (2013.01); *H01L 51/0059* (2013.01); *H01L 51/0072* (2013.01); *H01L 51/0074* (2013.01); *H01L 2251/5376* (2013.01); *H01L 2251/5384* (2013.01); *H01L 2251/552* (2013.01)

(56) References Cited

U.S. PATENT DOCUMENTS

| | | | |
|---|---|---|---|
| 7,471,041 | B2 | 12/2008 | Spindler |
| 7,586,257 | B2 | 9/2009 | Nishikawa et al. |
| 7,602,119 | B2 | 10/2009 | Miller et al. |
| 7,829,887 | B2 | 11/2010 | Chang et al. |
| 8,552,635 | B2 | 10/2013 | Kim et al. |
| 8,581,270 | B2 | 11/2013 | Park et al. |
| 2005/0221116 | A1* | 10/2005 | Cocchi ............... H01L 51/5036 428/690 |
| 2006/0238118 | A1 | 10/2006 | Spindler |
| 2006/0238119 | A1 | 10/2006 | Spindler |
| 2006/0238120 | A1* | 10/2006 | Miller ............... C09K 11/06 313/506 |
| 2007/0129545 | A1* | 6/2007 | Inoue ............... C07F 15/0033 544/225 |
| 2009/0309108 | A1 | 12/2009 | Chang et al. |
| 2011/0240969 | A1* | 10/2011 | Kim ............... H01L 51/0051 257/40 |
| 2011/0240970 | A1 | 10/2011 | Park et al. |
| 2012/0112172 | A1 | 5/2012 | Kashiwabara |
| 2013/0140533 | A1* | 6/2013 | Lee ............... H01L 51/5265 257/40 |

FOREIGN PATENT DOCUMENTS

| | | |
|---|---|---|
| CN | 102456714 A | 5/2012 |
| EP | 2 372 770 A2 | 10/2011 |
| JP | 2004-006362 | 1/2004 |
| JP | 2005-129509 A | 5/2005 |
| JP | 2007-073532 A | 3/2007 |
| JP | 2007-234241 A | 9/2007 |
| JP | 2008-539554 | 11/2008 |
| JP | 2008-539555 | 11/2008 |
| JP | 2008-539556 | 11/2008 |
| JP | 2009-302514 A | 12/2009 |
| JP | 2010-165510 A | 7/2010 |
| JP | 2011-134734 A | 7/2011 |
| JP | 2011-216470 A | 10/2011 |
| JP | 2011-249334 A | 12/2011 |
| JP | 2012-114073 A | 6/2012 |
| JP | 2012-195310 A | 10/2012 |
| KR | 2009-0128884 A | 12/2009 |
| KR | 2011-0109559 A | 10/2011 |
| KR | 2012-0047799 A | 5/2012 |
| WO | WO 2006/115960 A1 | 11/2006 |
| WO | WO 2006/116346 A2 | 11/2006 |
| WO | WO 2006/116347 A2 | 11/2006 |

OTHER PUBLICATIONS

Written Opinion re Application No. PCT/JP2013/079334, dated Feb. 10, 2014.

* cited by examiner

LIGHT-EMITTING ELEMENT, LIGHT-EMITTING DEVICE, ELECTRONIC APPLIANCE, AND LIGHTING DEVICE

BACKGROUND OF THE INVENTION

1. Field of the Invention

One embodiment of the present invention relates to a light-emitting element in which a light-emitting layer capable of emitting light by application of an electric field is provided between a pair of electrodes, and also relates to a light-emitting device and a lighting device including such a light-emitting element.

2. Description of the Related Art

Light-emitting elements which include organic compounds as a light-emitting layer and are characterized by thinness, lightweight, fast response, and direct current driving with low voltage are expected to be applied to next-generation flat panel displays. In particular, a display device in which light-emitting elements are arranged in matrix is considered to have advantages in a wide viewing angle and excellent visibility over a conventional liquid crystal display device.

It is said that a light-emitting element has the following light emission mechanism: when voltage is applied between a pair of electrodes with a light-emitting layer including a luminous body provided therebetween, electrons injected from the cathode and holes injected from the anode are recombined in an light emission center of the light-emitting layer to form molecular excitons, and energy is released and light is emitted when the molecular excitons relax to the ground state. A singlet excited state and a triplet excited state are known as excited states, and light emission can probably be obtained through either state. Light emission from the singlet excited state (S*) is called fluorescence, and light emission from the triplet excited state (T*) is called phosphorescence.

In order to improve element characteristics or productivity of such light-emitting elements, improvement of an element structure, development of a material, and the like have been actively carried out. Further, research and development have been extensively conducted on organic EL elements as light-emitting elements, and full-color organic EL elements have been actively developed.

As a way to achieve full-color display, for example, light-emitting layers of pixels are separately deposited. The light-emitting layers are deposited on necessary pixels using a shadow mask. In this case, to reduce cost by reducing the number of steps, Patent Document 1 discloses a structure in which layers except a light-emitting layer, for example, a hole-transport layer, an electron-transport layer, and a cathode are formed to be shared by a plurality of pixels.

REFERENCE

Patent Document

[Patent Document 1] Japanese Published Patent Application No. 2004-006362

SUMMARY OF THE INVENTION

In the case of the structure disclosed in Patent Document 1, since the hole-transport layer or the electron-transport layer is used to be shared by the plurality of pixels, pixels emitting different colors differ in element characteristics such as driving voltage. Further, in the case of such a structure, the hole-transport layer or the electron-transport layer is shared by pixels emitting different colors; therefore, each pixel does not have an optimal structure, which causes a problem in that an abnormal state of the element characteristics, e.g., an increase in driving voltage or a reduction in reliability, occurs in at least one of the plurality of pixels.

In view of the above problems, an object of one embodiment of the present invention is to provide a light-emitting element which includes a plurality of light-emitting layers between a pair of electrodes and has low driving voltage and high emission efficiency.

One embodiment of the present invention is a light-emitting element including first to third light-emitting layers between a cathode and an anode. The first light-emitting layer includes a first phosphorescent material and a first electron-transport material; the second light-emitting layer includes a second phosphorescent material and a second electron-transport material; the third light-emitting layer includes a fluorescent material and a third electron-transport material; the first to third light-emitting elements are provided in contact with an electron-transport layer positioned on a cathode side; and a triplet excitation energy level of a material included in the electron-transport layer is lower than triplet excitation energy levels of the first electron-transport material and the second electron-transport material.

Such a structure in which the electron-transport layer is in contact with the first to third light-emitting layers can increase productivity at the time of forming the light-emitting element. Further, the electron-transport layer is formed using a material whose triplet excitation energy level (T1 level) is lower than those of the first electron-transport material and the second electron-transport material. Since the first electron-transport material and the second electron-transport material have a high electron-transport property, the light-emission region of the light-emitting element of one embodiment of the present invention is formed in the light-emitting layer on the hole-transport layer side. Therefore, the first light-emitting layer and the second light-emitting layer are not affected by the low T1 level of the electron-transport layer, and thus, an element structure which enables low driving voltage and high emission efficiency can be obtained.

Another embodiment of the present invention is a light-emitting element including first to third light-emitting layers between a cathode and an anode. The first light-emitting layer includes a first phosphorescent material and a first electron-transport material; the second light-emitting layer includes a second phosphorescent material and a second electron-transport material; the third light-emitting layer includes a fluorescent material and a third electron-transport material and is in contact with the first and second light-emitting layers on a cathode side; and a triplet excitation energy level of the third electron-transport material is lower than triplet excitation energy levels of the first electron-transport material and the second electron-transport material.

When the third light-emitting layer is provided in contact with the first light-emitting layer and the second light-emitting layer on the cathode side in the above manner, the third light-emitting layer functions as an electron-transport layer over the first light-emitting layer and the second light-emitting layer and functions as a light-emitting layer in the third light-emitting layer. Note that the fluorescent material (also referred to as a dopant or a guest material) included in the third light-emitting layer does not contribute to light emission over the first light-emitting layer and the second light-emitting layer because the first electron-transport material and the second electron-transport material have a high electron-transport property. On the other hand, light emission can be obtained from the fluorescent material in the third light-emitting layer. That is, the third light-emitting layer has a function of an electron-transport layer and a function of a light-emitting layer at the same time; therefore, the third light-emitting layer can be used as an electron-transport layer to be shared over the first light-emitting layer and the second light-emitting layer, and can be used as a light-emitting layer in the third light-emitting layer. Thus, the productivity at the time of forming the light-emitting element can be increased.

A light-emitting device including the light-emitting element and an electronic device and a lighting device each including the light-emitting device are also included in the scope of one embodiment of the present invention. Therefore, the light-emitting device in this specification refers to an image display device, or a light source (including a lighting device). In addition, the light-emitting device includes, in its category, all of a module in which a light-emitting device is connected to a connector such as a flexible printed circuit (FPC), a tape carrier package (TCP), a module in which a printed wiring board is provided on the tip of a TCP, and a module in which an integrated circuit (IC) is directly mounted on a light-emitting element by a chip on glass (COG) method.

A light-emitting element which includes a plurality of light-emitting layers between a pair of electrodes and has low driving voltage and high emission efficiency can be provided as a light-emitting element of one embodiment present invention. Further, productivity can be improved at the time of forming the light-emitting element.

DETAILED DESCRIPTION OF THE INVENTION

Figure 1A:
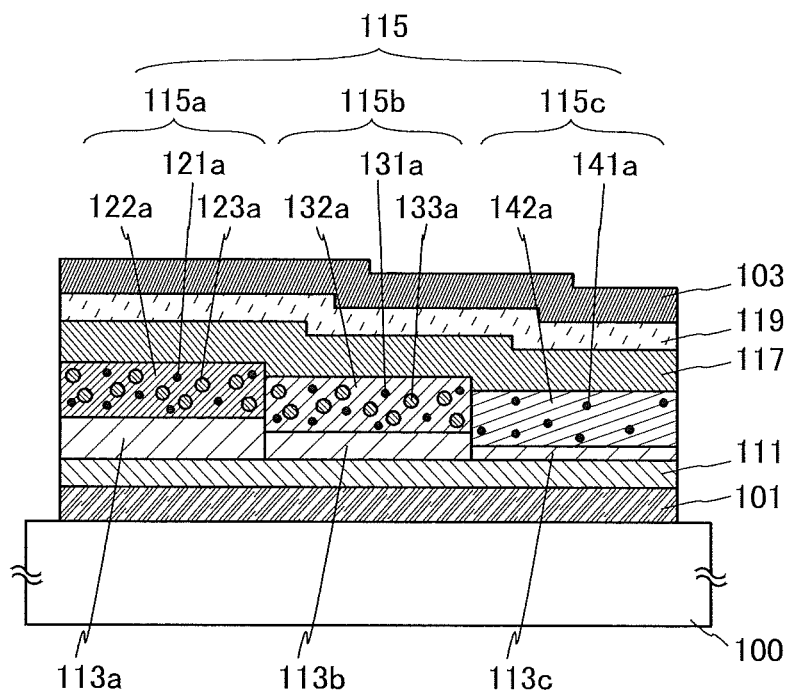
FIGS. 1A and 1B illustrate a light-emitting element of one embodiment of the present invention.

Embodiments and examples of the present invention will be explained below with reference to the drawings. However, the present invention is not limited to description to be given below, and it is to be easily understood that modes and details thereof can be variously modified without departing from the purpose and the scope of the present invention. Accordingly, the present invention should not be interpreted as being limited to the content of the embodiments and examples below.

Note that the position, the size, the range, or the like of each structure illustrated in drawings and the like is not accurately represented in some cases for simplification. Therefore, the disclosed invention is not necessarily limited to the position, the size, the range, or the like disclosed in the drawings and the like.

In this specification and the like, ordinal numbers such as "first", "second", and "third" are used in order to avoid confusion among components, and the terms do not mean limitation of the number of components.

[Embodiment 1]

In this embodiment, a structural concept of a light-emitting element of one embodiment of the present invention and a specific structure of the light-emitting element are described. First, the light-emitting element that is one embodiment of the present invention is described with reference to FIGS. 1A and 1B.

A light-emitting element illustrated in FIG. 1A includes a light-emitting layer 115 between a pair of electrodes (an anode 101 and a cathode 103). The light-emitting layer 115 includes a first light-emitting layer 115a including a first phosphorescent material 121a and a first electron-transport material 122a; a second light-emitting layer 115b including a second phosphorescent material 131a and a second electron-transport material 132a; and a third light-emitting layer 115c including a fluorescent material 141a and a third electron-transport material 142a.

The first light-emitting layer 115a, the second light-emitting layer 115b, and the third light-emitting layer 115c are each in contact with an electron-transport layer 117 which is positioned on the cathode 103 side.

The first light-emitting layer 115a may further include a first hole-transport material 123a, in addition to the first phosphorescent material 121a and the first electron-transport material 122a. The second light-emitting layer 115b may further include a second hole-transport material 133a, in addition to the second phosphorescent material 131a and the second electron-transport material 132a.

In the first light-emitting layer 115a, the first electron-transport material 122a functions as a host material, and the first phosphorescent material 121a functions as a guest material (also referred to as a dopant). The first hole-transport material 123a functions as an assist material. That is, the first phosphorescent material 121a and the first hole-transport material 123a are dispersed into the first electron-transport material 122a functioning as a host material. In the second light-emitting layer 115b, the second electron-transport material 132a functions as a host material, and the second phosphorescent material 131a functions as a guest material. The second hole-transport material 133a functions as an assist material. That is, the second phosphorescent material 131a and the second hole-transport material 133a are dispersed into the second electron-transport material 132a functioning as a host material. In the third light-emitting layer 115c, the third electron-transport material 142a functions as a host material, and the fluorescent material 141a functions as a guest material. That is, the fluorescent material 141a is dispersed into the third electron-transport material 142a functioning as a host material.

For example, a red-light-emitting phosphorescent material can be used as a light-emitting substance of the first phosphorescent material 121a. Further, a green-light-emitting phosphorescent material can be used as a light-emitting substance of the second phosphorescent material 131a. Furthermore, a blue-light-emitting fluorescent material can be used as a light-emitting substance of the fluorescent material 141a. Note that in this specification, the maximum emission wavelength of the red-light-emitting phosphorescent material is longer than 570 nm and shorter than or equal to 740 nm, the maximum emission wavelength of the green-light-emitting phosphorescent material is longer than 500 nm and shorter than or equal to 570 nm, and the maximum emission wavelength of the blue-light-emitting fluorescent material is longer than or equal to 400 nm and shorter than or equal to 500 nm.

In FIG. 1A, in addition to the light-emitting layer 115 and the electron-transport layer 117, a hole-injection layer 111, a first hole-transport layer 113a, a second hole-transport layer 113b, a third hole-transport layer 113c, and an electron-injection layer 119 are provided between the pair of electrodes.

Specifically, the light-emitting element illustrated in FIG. 1A includes the anode 101 over a substrate 100; the hole-injection layer 111 over the anode 101; the first hole-transport layer 113a over the hole-injection layer 111; the second hole-transport layer 113b over the hole-injection layer 111; the third hole-transport layer 113c over the hole-injection layer 111; the first light-emitting layer 115a over the first hole-transport layer 113a; the second light-emitting layer 115b over the second hole-transport layer 113b; the third light-emitting layer 115c over the third hole-transport layer 113c; the electron-transport layer 117 over the first light-emitting layer 115a, the second light-emitting layer 115b, and the third light-emitting layer 115c; the electron-injection layer 119 over the electron-transport layer 117; and the cathode 103 over the electron-injection layer 119.

In this manner, layers other than the light-emitting layer 115 and the electron-transport layer 117, such as a layer including a hole-injection or electron-injection substance, a layer including a hole-transport or electron-transport substance, a layer including a bipolar substance (a material having a high electron-transport property or a high hole-transport property), or the like may be formed between the pair of electrodes as necessary. However, such layers are not indispensable.

In the light-emitting element in FIG. 1A, the first hole-transport layer 113a, the second hole-transport layer 113b, and the third hole-transport layer 113c are provided on the respective light-emitting layers (i.e., the first light-emitting layer 115a, the second light-emitting layer 115b, and the third light-emitting layer 115c). However, one embodiment of the present invention is not limited thereto, and one hole-transport layer may be formed to be shared by the light-emitting layers. Further, in the light-emitting element in FIG. 1A, the optical path of light emitted from each light-emitting layer can be adjusted by adjusting the thickness of the first hole-transport layer 113a, the second hole-transport layer 113b, or the third hole-transport layer 113c.

In addition, in the light-emitting element in FIG. 1A, the electron-transport layer 117, the electron-injection layer 119, and the cathode 103 are shared by the light-emitting layer 115 (the first light-emitting layer 115a, the second light-emitting layer 115b, and the third light-emitting layer 115c). When the electron-transport layer 117, the electron-injection layer 119, and the cathode 103 are used to be shared by the light-emitting layer 115 in such a manner, productivity at the time of forming the light-emitting element can be increased. Note that at the time of forming the light-emitting element in FIG. 1A, the first hole-transport layer 113a, the second hole-transport layer 113b, and the third hole-transport layer 113c are each formed over the hole-injection layer 111, and the first light-emitting layer 115a, the second light-emitting layer 115b, and the third light-emitting layer 115c are each formed over the first hole-transport layer 113a, the second hole-transport layer 113b, and the third hole-transport layer 113c, respectively, by a separate-deposition step. The hole-transport layers and the light-emitting layers are sequentially fruited, whereby the number of times of separate deposition can be reduced. For example, the first hole-transport layer 113a and the first light-emitting layer 115a are formed successively, the second hole-transport layer 113b and the second light-emitting layer 115b are formed successively, and the third hole-transport layer 113c and the third light-emitting layer 115c are formed successively. Therefore, the light-emitting element in FIG. 1A can be formed by three-time separate deposition.

The first electron-transport material 122a and the second electron-transport material 132a in the light-emitting element in FIG. 1A have an extremely high electron-transport property. Therefore, light-emitting regions of the first light-emitting layer 115a and the second light-emitting layer 115b are formed in the vicinities of the first hole-transport layer 113a and the second hole-transport layer 113b. Therefore, light emission from the first light-emitting layer 115a and the second light-emitting layer 115b are not influenced or hardly influenced by the triplet excitation energy level of the electron-transport layer 117 even through the triplet excitation energy level of the electron-transport layer 117 is lower than those of the first electron-transport material 122a and the second electron-transport material 132a.

In other words, in the light-emitting element of one embodiment of the present invention, even in the case where the electron-transport layer 117 is used to be shared by the first light-emitting layer 115a, the second light-emitting layer 115b, and the third light-emitting layer 115c, each light-emitting layer can have an optimized element structure, whereby a light-emitting element with high productivity and high emission efficiency can be obtained.

Figure 1B:
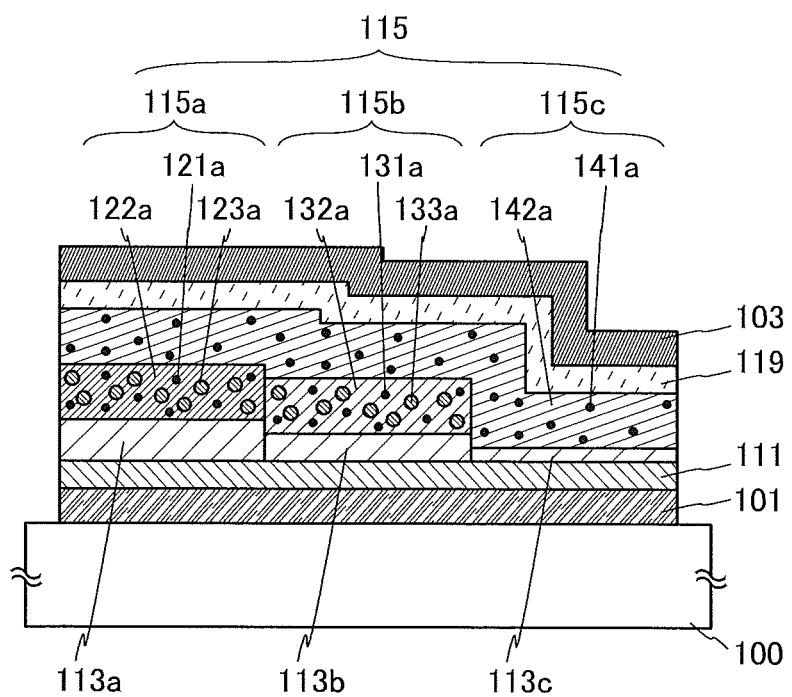

Next, a light-emitting element illustrated in FIG. 1B is described.

A light-emitting element illustrated in FIG. 1B includes the light-emitting layer 115 between a pair of electrodes (the anode 101 and the cathode 103). The light-emitting layer 115 includes the first light-emitting layer 115a including the first phosphorescent material 121a and the first electron-transport material 122a; the second light-emitting layer 115b including the second phosphorescent material 131a and the second electron-transport material 132a; and the third light-emitting layer 115c covering the first light-emitting layer 115a and second light-emitting layer 115b and including the fluorescent material 141a and the third electron-transport material 142a.

The third light-emitting layer 115c is provided on and in contact with the first light-emitting layer 115a and the second light-emitting layer 115b on the cathode 103 side.

The first light-emitting layer 115a may further include the first hole-transport material 123a, in addition to the first phosphorescent material 121a and the first electron-transport material 122a. The second light-emitting layer 115b may further include the second hole-transport material 133a, in addition to the second phosphorescent material 131a and the second electron-transport material 132a.

In FIG. 1B, in addition to the light-emitting layer 115, the hole-injection layer 111, the first hole-transport layer 113a, the second hole-transport layer 113b, the third hole-transport layer 113c, and the electron-injection layer 119 are provided between the pair of electrodes. However, these layers may be provided as needed.

Specifically, the light-emitting element illustrated in FIG. 1B includes the anode 101 over the substrate 100; the hole-injection layer 111 over the anode 101; the first hole-transport layer 113a over the hole-injection layer 111; the second hole-transport layer 113b over the hole-injection layer 111; the third hole-transport layer 113c over the hole-injection layer 111; the first light-emitting layer 115a over the first hole-transport layer 113a; the second light-emitting layer 115b over the second hole-transport layer 113b; the third light-emitting layer 115c over the first hole-transport layer 113a, the second hole-transport layer 113b, and the third hole-transport layer 113c; the electron-injection layer 119 over the third light-emitting layer 115c; and the cathode 103 over the electron-injection layer 119.

In the light-emitting element in FIG. 1B, the third light-emitting layer 115c functions as a light-emitting layer and also functions as an electron-transport layer of each of the first light-emitting layer 115a and the second light-emitting layer 115b.

Note that since the first electron-transport material 122a and the second electron-transport material 132a have a high electron-transport property, the fluorescent material 141a included in the third light-emitting layer 115c does not contribute to light emission in the first light-emitting layer 115a and the second light-emitting layer 115b. On the other hand, in the third light-emitting layer 115c, light emission can be obtained from the fluorescent material 141a included in the third light-emitting layer 115c.

That is, since the third light-emitting layer 115c has a function of an electron-transport layer and a function of a light-emitting layer at the same time in the light-emitting element of one embodiment of the present invention, the third light-emitting layer 115c over the first light-emitting layer 115a and the second light-emitting layer 115b can be used to be shared by the first light-emitting layer 115a and the second light-emitting layer 115b as an electron-transport layer, and the third light-emitting layer 115c over the third hole-transport layer 113c can be used as a light-emitting layer. Accordingly, a light-emitting element with high productivity and high emission efficiency can be obtained. Note that at the time of forming the light-emitting element in FIG. 1B, the first hole-transport layer 113a, the second hole-transport layer 113b, and the third hole-transport layer 113c are each formed over the hole-injection layer 111, and the first light-emitting layer 115a and the second light-emitting layer 115b are each formed over the first hole-transport layer 113a and the second hole-transport layer 113b, respectively, and the third light-emitting layer 115c is formed over the first light-emitting layer 115a, the second light-emitting layer 115b, and the third hole-transport layer 113c, by a separate-deposition step. The hole-transport layers and the light-emitting layers are sequentially formed, whereby the number of times of separate deposition can be reduced. For example, the first hole-transport layer 113a and the first light-emitting layer 115a are formed successively, the second hole-transport layer 113b and the second light-emitting layer 115b are formed successively, and the then third hole-transport layer 113c is formed. After that, the third light-emitting layer 115c is formed over the first light-emitting layer 115a, the second light-emitting layer 115b, and the third hole-transport layer 113c. Therefore, the light-emitting element in FIG. 1B can be formed by three-time separate deposition. A step for forming the electron-transport layer 117, which is performed in the formation process of the light-emitting element in FIG. 1A, can be omitted in the formation process of the light-emitting element in FIG. 1B.

Here, other component elements of the light-emitting elements in FIGS. 1A and 1B are described below in detail.

<Substrate>

The substrate 100 is used as a support of the light-emitting element. For example, glass, quartz, plastic, or the like can be used for the substrate 100. Alternatively, a flexible substrate can be used. A flexible substrate is a substrate that can be bent (is flexible); examples of the flexible substrate include a plastic substrate made of a polycarbonate, a polyarylate, or a polyethersulfone, and the like. A film (made of polypropylene, a polyester, poly(vinyl fluoride), poly (vinyl chloride), or the like), an inorganic film formed by evaporation, or the like can be used. Note that another material may be used as long as the material functions as a support medium in the manufacturing process of the light emitting element.

<Anode>

The anode 101 can be formed using one or more kinds of conductive metals and alloys, conductive compounds, and the like. In particular, it is preferable to use a material with a high work function (4.0 eV or more). Examples include indium tin oxide (ITO), indium tin oxide containing silicon or silicon oxide, indium zinc oxide, indium oxide containing tungsten oxide and zinc oxide, graphene, gold, platinum, nickel, tungsten, chromium, molybdenum, iron, cobalt, copper, palladium, and a nitride of a metal material (e.g., titanium nitride). Alternatively, the anode 101 may be formed as follows: silver, copper, aluminum, titanium, or the like is foamed to have a nanowire shape (or a thin-stripe shape), and then a conductive substance (a conductive organic material, graphene, or the like) is formed thereover by a coating method, a printing method, or the like.

<Cathode>

The cathode 103 can be formed using one or more kinds of conductive metals and alloys, conductive compounds, and the like. In particular, it is preferable to use a material with a low work function (3.8 eV or less). Examples include aluminum, silver, an element belonging to Group 1 or 2 of the periodic table (e.g., an alkali metal such as lithium or cesium, an alkaline earth metal such as calcium or strontium, or magnesium), an alloy containing any of these elements (e.g., Mg—Ag or Al—Li), a rare earth metal such as europium or ytterbium, and an alloy containing any of these rare earth metals.

<Hole-Injection Layer and Hole-Transport Layer>

As the substance having a high hole-transport property used for the hole-injection layer 111, the first hole-transport layer 113a, the second hole-transport layer 113b, and the third hole-transport layer 113c, the following can be given, for example: aromatic amine compounds such as 4,4'-bis[N-(1-naphthyl)-N-phenylamino]biphenyl (abbreviation: NPB or a-NPD), N,N'-bis(3-methylphenyl)-N,N'-diphenyl-[1,1'-biphenyl]-4,4'-diamine (abbreviation: TPD), 4,4',4"-tris(carbazol-9-yl)triphenylamine (abbreviation: TCTA), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like. Alternatively, the following carbazole derivative can be used: 4,4'-di(N-carbazolyl)biphenyl (abbreviation: CBP), 1,3,5-tris[4-(N-carbazolyl)phenyl]benzene (abbreviation: TCPB), and 9-[4-(10-phenyl-9-anthracenyl)phenyl]-9H-Carbazole (abbreviation: CzPA). These materials described here mainly are substances having a hole mobility of greater than or equal to $10^{-6}$ cm$^2$/(Vs). However, besides the above materials, others may be used as long as the material has a higher hole-transport property than an electron-transport property.

Furthermore, for the hole-injection layer 111, the first hole-transport layer 113a, the second hole-transport layer 113b, and the third hole-transport layer 113c, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N-phenylamino}phenyl)methacrylamide] (abbreviation: PTPDMA), or poly[N,N'-bis(4-butylphenyl)-N,N'-bis(phenyl) benzidine] (abbreviation: Poly-TPD) can be used.

In addition, a transition metal oxide can be given as an example of an acceptor substance which can be used for the hole-injection layer 111, the first hole-transport layer 113a, the second hole-transport layer 113b, and the third hole-transport layer 113c. As the transition metal oxide, oxides of metals belonging to Groups 4 to 8 of the periodic table are preferable. Specifically, molybdenum oxide is particularly preferable.

<First Light-Emitting Layer>

The first light-emitting layer 115a includes the first phosphorescent material 121a (guest material), the first electron-transport material 122a (host material), and the first hole-transport material 123a (assist material). Further, it is preferable that the first light-emitting layer 115a emit red light.

Note that the T1 level of the host material (or the assist material) is preferably higher than the T1 level of the guest material. This is because, when the T1 level of the host material is lower than that of the guest material, the triplet excitation energy of the guest material, which is to contribute to light emission, is quenched by the host material and accordingly the emission efficiency is decreased.

An exciplex can be formed with the combination of the first phosphorescent material 121a (guest material), the first electron-transport material 122a (host material), and the first hole-transport material 123a (assist material). It is preferable that the emission spectrum of the exciplex overlap the absorption spectrum of the first phosphorescent material 121a (guest material) and that a peak of the emission spectrum of the exciplex have a longer wavelength than a peak of the absorption spectrum of the first phosphorescent material 121a (guest material).

Here, for improvement in efficiency of energy transfer from a host material to a guest material, FÖrster mechanism (dipole-dipole interaction) and Dexter mechanism (electron exchange interaction), which are known as mechanisms of energy transfer between molecules, are considered. According to the mechanisms, it is preferable that an emission spectrum of a host material (fluorescence spectrum in energy transfer from a singlet excited state, phosphorescence spectrum in energy transfer from a triplet excited state) largely overlap with an absorption spectrum of a guest material (specifically, spectrum in an absorption band on the longest wavelength (lowest energy) side).

However, in general, it is difficult to obtain an overlap between a fluorescence spectrum of a host material and an absorption spectrum in an absorption band on the longest wavelength (lowest energy) side of a guest material. The reason for this is as follows: if the fluorescence spectrum of the host material overlaps with the absorption spectrum in the absorption band on the longest wavelength (lowest energy) side of the guest material, since a phosphorescence spectrum of the host material is located on a longer wavelength (lower energy) side than the fluorescence spectrum, the T1 level of the host material becomes lower than the T1 level of the phosphorescent compound and the above-described problem of quenching occurs; yet, when the host material is designed in such a manner that the T1 level of the host material is higher than the T1 level of the phosphorescent compound to avoid the problem of quenching, the fluorescence spectrum of the host material is shifted to the shorter wavelength (higher energy) side, and thus the fluorescence spectrum does not have any overlap with the absorption spectrum in the absorption band on the longest wavelength (lowest energy) side of the guest material. For that reason, in general, it is difficult to obtain an overlap between a fluorescence spectrum of a host material and an absorption spectrum in an absorption band on the longest wavelength (lowest energy) side of a guest material so as to maximize energy transfer from a singlet excited state of the host material.

Thus, it is preferable that the first light-emitting layer 115a included in the light-emitting element of one embodiment of the present invention include the first phosphorescent material 121a serving as a guest material (referred to as a first substance), the first electron-transport material 122a serving as a host material (referred to as a second substance), and the first hole-transport material 123a (referred to as a third substance), and the combination of the host material and the third substance form an exciplex. In that case, the host material and the third substance form an exciplex at the time of recombination of carriers (electrons and holes) in the light-emitting layer.

Thus, in the light-emitting layer, fluorescence spectra of the host material and the third substance are converted into an emission spectrum of the exciplex which is located on a longer wavelength side. Moreover, when the host material and the third substance are selected such that the emission spectrum of the exciplex has a large overlap with the absorption spectrum of the guest material, energy transfer from a singlet excited state can be maximized. Note that also in the case of a triplet excited state, energy transfer from the exciplex, not the host material, is assumed to occur. In one embodiment of the present invention to which such a structure is applied, energy transfer efficiency can be improved owing to energy transfer utilizing an overlap between an emission spectrum of an exciplex and an absorption spectrum of a phosphorescent compound; accordingly, a light-emitting element with high external quantum efficiency can be provided.

In the case where the first electron-transport material 122a (host material) and the first hole-transport material 123a (assist material) are used, carrier balance can be controlled by a mixing ratio thereof. Specifically, the mixing ratio of the first electron-transport material 122a to the first hole-transport material 123a is preferably in the range of 1:9 to 9:1 (weight ratio).

Energy transfer (exciton diffusion) between exciplexes is not likely to occur; therefore, the use of the exciplex in the above manner can prevent exciton diffusion to the electron-transport layer 117.

A phosphorescent material having an emission peak at 600 nm to 700 nm can be given as an example of the first phosphorescent material 121a used for the first light-emitting layer 115a. Examples of the phosphorescent material include organometallic iridium complexes having pyrimidine skeletons, such as (diisobutyrylmethanato)bis[4,6-bis (3-methylphenyl)pyrimidinato]iridium(III) (abbreviation: [Ir(5mdppm)$_2$(dibm)]), bis[4,6-bis(3-methylphenyl)pyrimidinato] (dipivaloylmethanato)iridium(III) (abbreviation: [Ir (5mdppm)$_2$(dpm)]), and bis[4,6-di(naphthalen-1-yl)pyrimidinato] (dipivaloylmethanato)iridium(III) (abbreviation: [Ir (d1npm)$_2$(dpm)]); organometallic iridium complexes having pyrazine skeletons, such as (acetylacetonato)bis(2,3,5-triphenylpyrazinato)iridium(III) (abbreviation: [Ir(tppr)$_2$(acac)]), bis(2,3,5-triphenylpyrazinato) (dipivaloylmethanato) iridium(III) (abbreviation: [Ir(tppr)$_2$(dpm)]), and (acetylacetonato)bis[2,3-bis(4-fluorophenyl)quinoxalinato]iridium (III) (abbreviation: [Ir(Fdpq)$_2$(acac)]); and organometallic iridium complexes having pyridine skeletons, such as tris (1-phenylisoquinolinato-N,C$^{2'}$)iridium(III) (abbreviation: [Ir(piq)$_3$]) and bis(1-phenylisoquinolinato-N,C$^{2'}$)iridium (III)acetylacetonate (abbreviation: [Ir(piq)$_2$(acac)]). Among the materials given above, the organometallic iridium complexes having pyrimidine skeletons have distinctively high reliability and emission efficiency and are thus especially preferable. Further, the organometallic iridium complexes having pyrazine skeletons can provide red light emission with favorable chromaticity.

As the first electron-transport material 122a that can be used for the first light-emitting layer 115a, a π-electron deficient heteroaromatic compound such as a nitrogen-containing heteroaromatic compound is preferable; for example, the following can be given: heterocyclic compounds (e.g., an oxadiazole derivative, an imidazole derivative, and a triazole derivative) having polyazole skeletons, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis [5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3, 5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBTBIm-II); heterocyclic compounds (e.g., a pyrazine derivative, a pyrimidine derivative, a pyridazine derivative, a quinoxaline derivative, and a dibenzoquinoxaline derivative) having diazine skeletons, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h] quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl) phenyl]pyrimidine (abbreviation: 4,6mPnP2Pm), and 4,6-bis[3-(4-dibenzothienyl)phenyl]pyrimidine (abbreviation: 4,6mDBTP2Pm-II); and heterocyclic compounds (e.g., a pyridine derivative, a quinoline derivative, and a dibenzoquinoline derivative) having pyridine skeletons, such as 3,5-bis[3-(9H-carbazol-9-yl)phenyl]pyridine (abbreviation: 3,5DCzPPy) and 1,3,5-tri[3-(3-pyridyl)-phen-3-yl]benzene (abbreviation: TmPyPB). Among the above materials, heterocyclic compounds having diazine skeletons and heterocyclic compounds having pyridine skeletons have high reliability and are thus preferable. Specifically, heterocyclic compounds having diazine (pyrimidine or pyrazine) skeletons have a high electron-transport property to contribute to a reduction in drive voltage.

As the first hole-transport material 123a which can be used for the first light-emitting layer 115a, a π-electron rich heteroaromatic compound (e.g., a carbazole derivative or an indole derivative) or an aromatic amine compound is preferable; for example, the following can be given: compounds having aromatic amine skeletons such as 4,4'-bis[N-(1-naphthyl)-N-phenylamino]biphenyl (abbreviation: NPB), N,N'-bis(3-methylphenyl)-N,N-diphenyl-[1,1'-biphenyl]-4, 4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'- (9-phenyl-9H-carbazol-3-yl)triphenylamine (abbreviation: PCBA1BP), 4,4'-diphenyl-4''-(9-phenyl-9H-carbazol-3-yl) triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]-fluoren-2-amine (abbreviation: PCBAF), and N-phenyl-N-[4-(9-phenyl-9H-carbazol-3-yl)phenyl]-spiro-9,9'-bifluoren-2-amine (abbreviation: PCBASF); compounds having carbazole skeletons such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenyl-carbazole (abbreviation: CzTP), and 3,3'-bis(9-phenyl-9H-carbazole) (abbreviation: PCCP); compounds having thiophene skeletons such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having furan skeletons such as 4,4',4"-(benzene-1,3,5-triyl)tri(dibenzofuran) (abbreviation: DBF3P-II), or 4-{3-[3-(9-phenyl-9H-fluoren-9-yl)phenyl]phenyl}dibenzofuran (abbreviation: mmDBFFLBi-II). Among the above materials, compounds having aromatic amine skeletons and compounds having carbazole skeletons are preferable because these compounds are highly reliable and have high hole-transport properties to contribute to a reduction in drive voltage.

<Second Light-Emitting Layer>

The second light-emitting layer 115b includes the second phosphorescent material 131a (guest material), the second electron-transport material 132a (host material), and the second hole-transport material 133a (assist material). Further, it is preferable that the second light-emitting layer 115b emit green light.

An exciplex can be formed with the combination of the second phosphorescent material 131a (guest material), the second electron-transport material 132a (host material), and the second hole-transport material 133a (assist material). It is preferable that the emission spectrum of the exciplex overlap the absorption spectrum of the second phosphorescent material 131a (guest material) and that a peak of the emission spectrum of the exciplex have a longer wavelength than a peak of the absorption spectrum of the second phosphorescent material 131a (guest material). Note that as for the structure of the exciplex, a structure similar to that of the first light-emitting layer 115a can be applied to the second light-emitting layer 115b.

In the case where the second electron-transport material 132a (host material) and the second hole-transport material 133a (assist material) are used, carrier balance can be controlled by a mixing ratio thereof. Specifically, the mixing ratio of the second electron-transport material 132a to the second hole-transport material 133a is preferably in the range of 1:9 to 9:1 (weight ratio).

Energy transfer (exciton diffusion) between exciplexes is not likely to occur; therefore, the use of the exciplex in the above manner can prevent exciton diffusion to the electron-transport layer 117.

A phosphorescent material having an emission peak at 520 nm to 600 nm can be given as an example of the second phosphorescent material 131a used for the second light-emitting layer 115b. Examples of the phosphorescent material include organometallic iridium complexes having pyrimidine skeletons, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[4-(2-norbornyl)-6-phenylpyrimidinato]iridium(III) (endo- and exo-mixture) (abbreviation: [Ir(nbppm)$_2$(acac)]), (acetylacetonato)bis[5-methyl-6-(2-methylphenyl)-4-phenylpyrimidinato]iridium (III) (abbreviation: [Ir(mpmppm)$_2$(acac)]), and (acetylacetonato)bis(4,6-diphenylpyrimidinato)iridium(III) (abbreviation: [Ir(dppm)$_2$(acac)]); organometallic iridium complexes having pyrazine skeletons, such as (acetylacetonato)bis(3,5-dimethyl-2-phenylpyrazinato)iridium(III) (abbreviation: [Ir(mppr-Me)$_2$(acac)]) and (acetylacetonato)bis(5-isopropyl-3-methyl-2-phenylpyrazinato)iridium(III) (abbreviation: [Ir(mppr-iPr)$_2$(acac)]); and organometallic iridium complexes having pyridine skeletons, such as tris(2-phenylpyridinato-N,C$^{2'}$)iridium(III) (abbreviation: [Ir(ppy)$_3$]), bis(2-phenylpyridinato-N,C$^{2'}$)iridium(III)acetylacetonate (abbreviation: [Ir(ppy)$_2$(acac)]), bis(benzo[h]quinolinato)iridium(III)acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,C$^{2'}$)iridium(III) (abbreviation: [Ir(pq)$_3$]), and bis(2-phenylquinolinato-N,C$^{2'}$)iridium(III)acetylacetonate (abbreviation: [Ir(pq)$_2$(acac)]). Among the materials given above, the organometallic iridium complexes having pyrimidine skeletons have distinctively high reliability and emission efficiency and thus especially preferable.

A material similar to the material of the first electron-transport material 122a can be used as the second electron-transport material 132a that can be used for the second light-emitting layer 115b. Alternatively, a material similar to the material of the first hole-transport material 123a can be used as the second hole-transport material 133a that can be used for the second light-emitting layer 115b.

<Third Light-Emitting Layer>

The third light-emitting layer 115c includes the fluorescent material 141a (guest material) and the third electron-transport material 142a (host material). Further, it is preferable that the third light-emitting layer 115c emit blue light.

Examples of the fluorescent material 141a which can be used for the third light-emitting layer 115c include N,N'-bis[4-(9-phenyl-9H-fluoren-9-yl)phenyl]-N,N'-diphenyl-pyrene-1,6-diamine (abbreviation: 1,6FLPAPrn), N,N'-bis(3-methylphenyl)-N,N'-bis[3-(9-phenyl-9H-fluoren-9-yl)phenyl]-pyrene-1,6-diamine (abbreviation: 1,6mMemFLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), and 4-(10-phenyl-9-anthryl)-4'-(9-phenyl-9H-carbazol-3-yl)triphenylamine (abbreviation: PCBAPA). Fluorescent compounds having pyrene skeletons are particularly preferable because of their high hole-trapping properties, high emission efficiency, and high reliability. In addition, condensed aromatic diamine compounds typified by pyrenediamine compounds such as 1,6FLPAPrn and 1,6mMemFLPAPrn are particularly preferable because of their high hole-trapping properties, high emission efficiency, and high reliability.

As the third electron-transport material 142a which can be used for the third light-emitting layer 115c, for example, an organic compound having an anthracene skeleton is preferable. As the organic compound having an anthracene skeleton, for example, an electron-transport compound which easily accepts holes such as 9-[4-(10-phenyl-9-anthracenyl) phenyl]-9H-carbazole (abbreviation: CzPA), 9-phenyl-3-[4-(10-phenyl-9-anthryl)phenyl]-9H-carbazole (abbreviation: PCzPA), 3,6-diphenyl-9-[4-(10-phenyl-9-anthryl)phenyl]-9H-carbazole (abbreviated to DPCzPA), 9,10-bis(3,5-diphenylphenyl)anthracene (abbreviation: DPPA), 9,10-di(2-naphthyl)anthracene (abbreviation: DNA), and 2-tert-butyl-9,10-bis(4-phenylphenyl)anthracene (abbreviation: t-BuDBA) can be preferably used. In the light-emitting element of one embodiment of the present invention, the third electron-transport material 142a preferably has an anthracene skeleton to have a hole-trapping property in addition to an electron-transport property.

<Electron-Transport Layer>

The electron-transport layer 117 is a layer including a substance having a high electron-transport property. The triplet excitation energy level of the material forming the electron-transport layer 117 is lower than those of the first electron-transport material 122a and the second electron-transport material 132a that are used for the first light-emitting layer 115a and the second light-emitting layer 115b. As such a material, a material similar to the third electron-transport material 142a that can be used for the third light-emitting layer 115c can be used.

<Electron-Injection Layer>

The electron-injection layer 119 is a layer that includes a substance having a high electron-injection property. For the electron-injection layer 119, an alkali metal compound or an alkaline earth metal compound, such as lithium fluoride (LiF), cesium fluoride (CsF), calcium fluoride ($CaF_2$), or lithium oxide ($LiO_x$) can be used. Alternatively, a rare earth metal compound like erbium fluoride ($ErF_3$) can be used.

Alternatively, a composite material in which an organic compound and an electron donor (donor) are mixed may be used for the electron-injection layer 119. The composite material is superior in an electron-injection property and an electron-transport property, since electrons are generated in the organic compound by the electron donor. In this case, the organic compound here is preferably a material excellent in transporting the generated electrons, and as the electron donor, a substance exhibiting an electron-donating property with respect to the organic compound may be used. Specifically, an alkali metal, an alkaline earth metal, and a rare earth metal are preferable, and lithium, cesium, magnesium, calcium, erbium, ytterbium, and the like are given. Further, an alkali metal oxide or an alkaline earth metal oxide is preferable, and for example, lithium oxide, calcium oxide, barium oxide, and the like can be given. Alternatively, Lewis base such as magnesium oxide can also be used. An organic compound such as tetrathiafulvalene (abbreviation: TTF) can also be used.

Note that the hole-injection layer 111, the first hole-transport layer 113a, the second hole-transport layer 113b, the third hole-transport layer 113c, the first light-emitting layer 115a, the second light-emitting layer 115b, the third light-emitting layer 115c, the electron-transport layer 117, and the electron-injection layer 119 each can be formed by an evaporation method (including a vacuum evaporation method), an inkjet method, a coating method, or the like.

Light emission obtained from the first light-emitting layer 115a, the second light-emitting layer 115b, and the third light-emitting layer 115c of the light-emitting element is extracted to the outside through one or both of the anode 101 and the cathode 103. Thus, one or both of the anode 101 and the cathode 103 in this embodiment are an electrode having a light-transmitting property.

This embodiment can be implemented in appropriate combination with any of the structures described in the other embodiments and examples.

[Embodiment 2]

In this embodiment, modification examples of the light-emitting elements of one embodiment of the present invention in FIGS. 1A and 1B are described with reference to FIGS. 2A and 2B and FIGS. 3A and 3B. Note that portions similar to those in the above embodiments and portions having functions similar to those in the above embodiments are given the same reference numerals, and detailed description thereof is omitted.

Figure 2A:
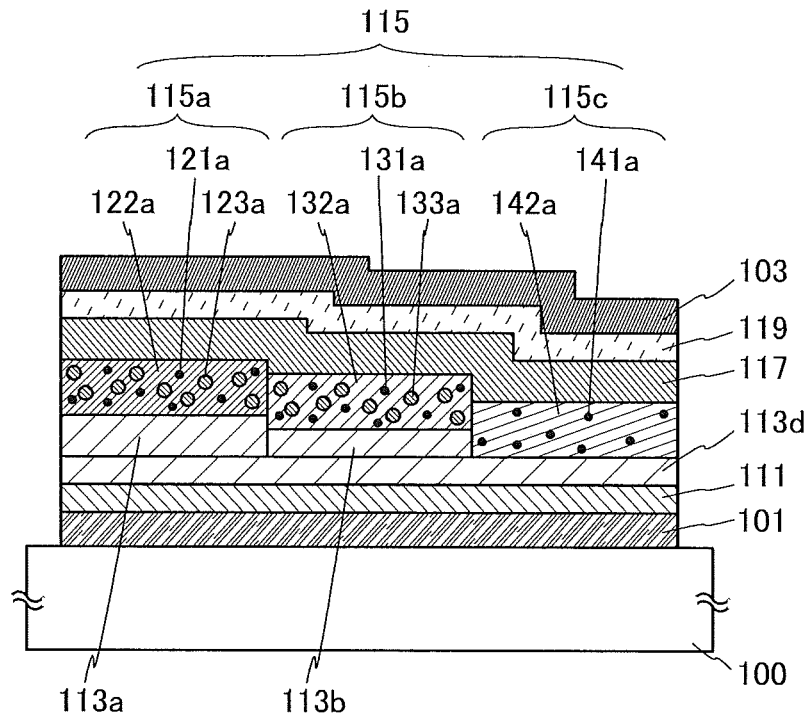
FIGS. 2A and 2B each illustrate a light-emitting element of one embodiment of the present invention.

A light-emitting element illustrated in FIG. 2A includes the light-emitting layer 115 between a pair of electrodes (the anode 101 and the cathode 103). The light-emitting layer 115 includes the first light-emitting layer 115a including the first phosphorescent material 121a and the first electron-transport material 122a; the second light-emitting layer 115b including the second phosphorescent material 131a and the second electron-transport material 132a; and the third light-emitting layer 115c including the fluorescent material 141a and the third electron-transport material 142a.

The first light-emitting layer 115a, the second light-emitting layer 115b, and the third light-emitting layer 115c are each in contact with the electron-transport layer 117 which is positioned on the cathode 103 side.

The first light-emitting layer 115a may further include the first hole-transport material 123a, in addition to the first phosphorescent material 121a and the first electron-transport material 122a. The second light-emitting layer 115b may further include the second hole-transport material 133a, in addition to the second phosphorescent material 131 1a and the second electron-transport material 132a.

In FIG. 2A, in addition to the light-emitting layer 115 and the electron-transport layer 117, the hole-injection layer 111, the first hole-transport layer 113a, the second hole-transport layer 113b, a fourth hole-transport layer 113d, and the electron-injection layer 119 are provided between the pair of electrodes.

Specifically, the light-emitting element illustrated in FIG. 2A includes the anode 101 over the substrate 100; the hole-injection layer 111 over the anode 101; the fourth hole-transport layer 113d over the hole-injection layer 111; the first hole-transport layer 113a over the fourth hole-transport layer 113d; the second hole-transport layer 113b over the fourth hole-transport layer 113d; the first light-emitting layer 115a over the first hole-transport layer 113a; the second light-emitting layer 115b over the second hole-transport layer 113b; the third light-emitting layer 115c over the fourth hole-transport layer 113d; the electron-transport layer 117 over the first light-emitting layer 115a, the second light-emitting layer 115b, and the third light-emitting layer 115c; the electron-injection layer 119 over the electron-transport layer 117; and the cathode 103 over the electron-injection layer 119.

Figure 2B:
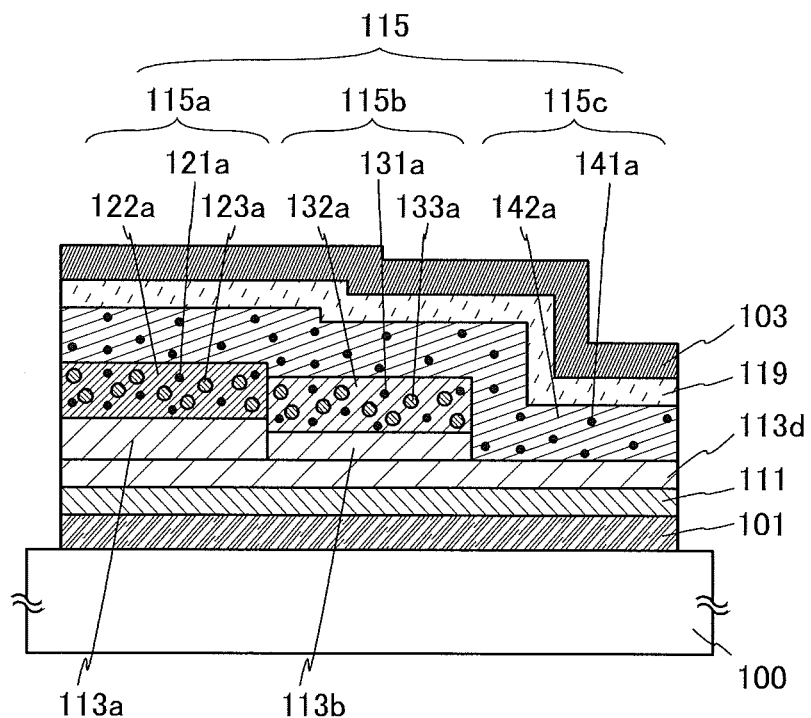

Next, a light-emitting elements illustrated in FIG. 2B is described below.

A light-emitting element illustrated in FIG. 2B includes the light-emitting layer 115 between a pair of electrodes (the anode 101 and the cathode 103). The light-emitting layer 115 includes the first light-emitting layer 115a including the first phosphorescent material 121a and the first electron-transport material 122a; the second light-emitting layer 115b including the second phosphorescent material 131a and the second electron-transport material 132a; and the third light-emitting layer 115c covering the first light-emitting layer 115*a* and second light-emitting layer 115*b* and including the fluorescent material 141*a* and the third electron-transport material 142*a*.

The third light-emitting layer 115*c* is in contact with the first light-emitting layer 115*a* and the second light-emitting layer 115*b* on the cathode 103 side.

The first light-emitting layer 115*a* may further include the first hole-transport material 123*a*, in addition to the first phosphorescent material 121*a* and the first electron-transport material 122*a*. The second light-emitting layer 115*b* may further include the second hole-transport material 133*a*, in addition to the second phosphorescent material 13 1a and the second electron-transport material 132*a*.

In FIG. 2B, in addition to the light-emitting layer 115, the hole-injection layer 111, the first hole-transport layer 113*a*, the second hole-transport layer 113*b*, the fourth hole-transport layer 113*d*, and the electron-injection layer 119 are provided between the pair of electrodes.

Specifically, the light-emitting element illustrated in FIG. 2B includes the anode 101 over the substrate 100; the hole-injection layer 111 over the anode 101; the fourth hole-transport layer 113*d* over the hole-injection layer 111; the first hole-transport layer 113*a* over the fourth hole-transport layer 113*d*; the second hole-transport layer 113*b* over, the fourth hole-transport layer 113*d*; the first light-emitting layer 115*a* over the first hole-transport layer 113*a*; the second light-emitting layer 115*b* over the second hole-transport layer 113*b*; the third light-emitting layer 115*c* over the first light-emitting layer 115*a*, the second light-emitting layer 115*b*, and the fourth hole-transport layer 113*d*; the electron-injection layer 119 over the third light-emitting layer 115*c*; and the cathode 103 over the electron-injection layer 119.

The light-emitting elements in FIGS. 2A and 2B are different from those in FIGS. 1A and 1B in that the fourth hole-transport layer 113*d* is provided over the hole-injection layer 111. Further, the third hole-transport layer 113*c* is not provided in the third light-emitting layer 115*c*. That is, the third light-emitting layer 115*c* is in contact with the fourth hole-transport layer 113*d*. A material similar to that of the third hole-transport layer 113*c* can be used for the fourth hole-transport layer 113*d*.

The fourth hole-transport layer 113*d* can be used to be shared by the first light-emitting layer 115*a*, the second light-emitting layer 115*b*, and the third light-emitting layer 115*c*. Therefore, in the light-emitting elements in. FIGS. 2A and 2B, as well as an excellent effect of the light-emitting elements in FIGS. 1A and 1B of one embodiment of the present invention, productivity at the time of forming the light-emitting element can be increased. Note that at the time of forming the light-emitting element in FIG. 2A, the first hole-transport layer 113*a*, the second hole-transport layer 113*b*, the first light-emitting layer 115*a*, the second light-emitting layer 115*b*, and the third light-emitting layer 115*c* are each formed by a separate-deposition step. The hole-transport layers and the light-emitting layers are sequentially formed, whereby the number of times of separate deposition can be reduced. For example, the first hole-transport layer 113*a* and the first light-emitting layer 115*a* are formed successively, the second hole-transport layer 113*b* and the second light-emitting layer 115*b* are formed successively, and then the third light-emitting layer 115*c* is formed. Therefore, the light-emitting element in FIG. 2A can be formed by three-time separate deposition. Further, at the time of forming the light-emitting element in FIG. 2B, the first hole-transport layer 113*a*, the second hole-transport layer 113*b*, the first light-emitting layer 115*a*, and the second light-emitting layer 115*b* are each formed by a separate-deposition step. Furthermore, successive formation of the hole-transport layers and the light-emitting layers can reduce the number of times for separate deposition. For example, the first hole-transport layer 113*a* and the first light-emitting layer 115*a* are successively formed, and the second hole-transport layer 113*b* and the second light-emitting layer 115*b* are successively formed. Thus, the light-emitting element in FIG. 2B can be formed by two-time separate deposition.

In the light-emitting elements in FIGS. 2A and 2B, the first light-emitting layer 115*a* and the second light-emitting layer 115*b* are separately formed to be in contact with the first hole-transport layer 113*a* and the second hole-transport layer 113*b*, respectively. Therefore, an optimal element structure can be achieved in each light-emitting layer, so that a light-emitting element with high emission efficiency can be achieved in each light-emitting layer.

In the light-emitting elements in FIGS. 2A and 2B, an optical path in each light-emitting layer can be adjusted by adjusting the thicknesses of the first hole-transport layer 113*a*, the second hole-transport layer 113*b*, and the fourth hole-transport layer 113*d*.

Figure 3A:
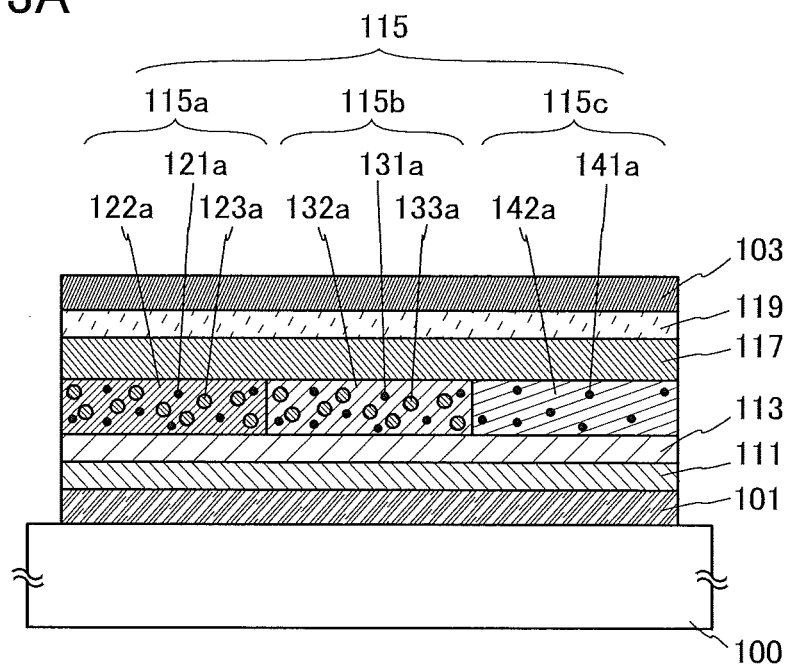
FIGS. 3A and 3B each illustrate a light-emitting element of one embodiment of the present invention.

Next, a light-emitting element illustrated in FIG. 3A is described below.

A light-emitting element illustrated in FIG. 3A includes the light-emitting layer 115 between a pair of electrodes (the anode 101 and the cathode 103). The light-emitting layer 115 includes the first light-emitting layer 115*a* including the first phosphorescent material 121*a* and the first electron-transport material 122*a*; the second light-emitting layer 115*b* including the second phosphorescent material 131*a* and the second electron-transport material 132*a*; and the third light-emitting layer 115*c* including the fluorescent material 141*a* and the third electron-transport material 142*a*.

Each of the first light-emitting layer 115*a*, the second light-emitting layer 115*b*, and the third light-emitting layer 115*c* is in contact with the electron-transport layer 117 provided on the cathode 103 side.

The first light-emitting layer 115*a* may further include the first hole-transport material 123*a*, in addition to the first phosphorescent material 121*a* and the first electron-transport material 122*a*. The second light-emitting layer 115*b* may further include the second hole-transport material 133*a*, in addition to the second phosphorescent material 131*a* and the second electron-transport material 132*a*.

In FIG. 3A, the hole-injection layer 111, the hole-transport layer 113, and the electron-injection layer 119 are provided between the pair of electrodes, in addition to the light-emitting layer 115.

Specifically, the light-emitting element in FIG. 3A includes the anode 101 over the substrate 100; the hole-injection layer 111 over the anode 101; the hole-transport layer 113 over the hole-injection layer 111; the first light-emitting layer 115*a* over the hole-transport layer 113; the second light-emitting layer 115*b* over the hole-transport layer 113; the third light-emitting layer 115*c* over the hole-transport layer 113; the electron-injection layer 119 over the first light-emitting layer 115*a*, the second light-emitting layer 115*b*, and the third light-emitting layer 115*c*; and the cathode 103 over the electron-injection layer 119.

Figure 3B:
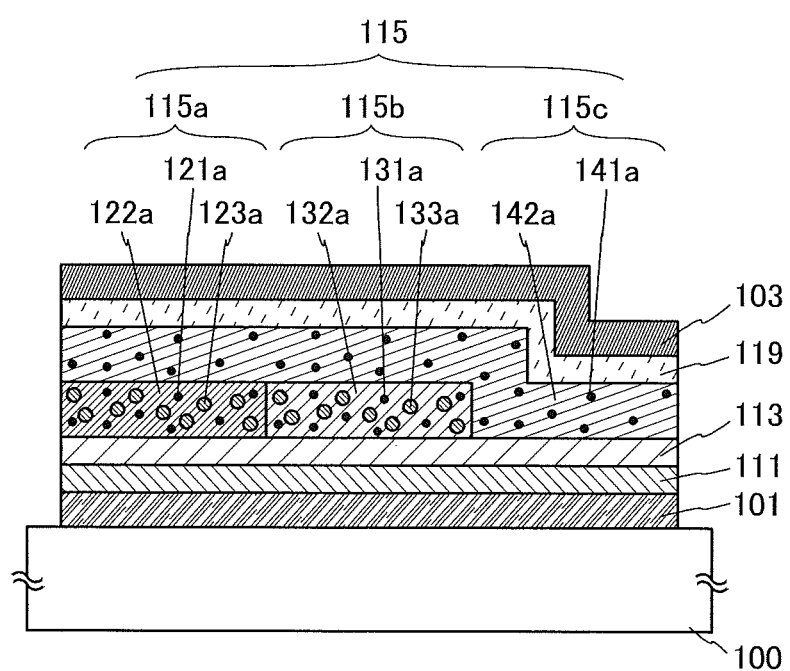

Next, a light-emitting elements illustrated in FIG. 3B is described below.

A light-emitting element illustrated in FIG. 3B includes the light-emitting layer 115 between a pair of electrodes (the anode 101 and the cathode 103). The light-emitting layer 115 includes the first light-emitting layer 115*a* including the first phosphorescent material 121*a* and the first electron-transport material 122a; the second light-emitting layer 115b including the second phosphorescent material 131a and the second electron-transport material 132a; and the third light-emitting layer 115c covering the first light-emitting layer 115a and second light-emitting layer 115b and including the fluorescent material 141a and the third electron-transport material 142a.

The third light-emitting layer 115c is in contact with the first light-emitting layer 115a and the second light-emitting layer 115b on the cathode 103 side.

The first light-emitting layer 115a may further include the first hole-transport material 123a, in addition to the first phosphorescent material 121a and the first electron-transport material 122a. The second light-emitting layer 115b may further include the second hole-transport material 133a, in addition to the second phosphorescent material 13 la and the second electron-transport material 132a.

In FIG. 3B, in addition to the light-emitting layer 115, the hole-injection layer 111, the hole-transport layer 113, and the electron-injection layer 119 are provided between the pair of electrodes.

Specifically, the light-emitting element in FIG. 3B includes the anode 101 over the substrate 100; the hole-injection layer 111 over the anode 101; the hole-transport layer 113 over the hole-injection layer 111; the first light-emitting layer 115a over the hole-transport layer 113; the second light-emitting layer 115b over the hole-transport layer 113; the third light-emitting layer 115c over the first light-emitting layer 115a, the second light-emitting layer 115b, and the hole-transport layer 113; the electron-injection layer 119 over the third light-emitting layer 115c; and the cathode 103 over the electron-injection layer 119.

The light-emitting elements in FIGS. 3A and 3B are different from those in FIGS. 1A and 1B in that the hole-transport layer 113 is formed over the hole-injection layer 111. That is, the hole-transport layer 113 can be used as a hole-transport layer which is shared by the first light-emitting layer 115a, the second light-emitting layer 115b, and the third light-emitting layer 115c. A material similar to that of the third hole-transport layer 113c can be used for the hole-transport layer 113. Therefore, in the light-emitting elements in FIGS. 3A and 3B, as well as an excellent effect of the light-emitting elements in FIGS. 1A and 1B of one embodiment of the present invention, productivity at the time of forming the light-emitting element can be increased. Note that in the case where the light-emitting element in FIG. 3A is formed, the first light-emitting layer 115a, the second light-emitting layer 115b, and the third light-emitting layer 115c are each formed by a separate-deposition step; that is, the total number of separate-deposition steps is three. In the case where the light-emitting element in FIG. 3B, the first light-emitting layer 115a and the second light-emitting layer 115b are each formed by a separate-deposition step; that is, the total number of separate-deposition steps is two.

Note that in the element structures in FIGS. 3A and 3B, since the hole-transport layer 113 is used to be shared by the first light-emitting layer 115a, the second light-emitting layer 115b, and the third light-emitting layer 115c, one or two of the first light-emitting layer 115a, the second light-emitting layer 115b and the third light-emitting layer 115c might be reduced in their element characteristics. Note that in the case where productivity takes precedence of element characteristics, the structures in FIGS. 3A and 3B may be applied. The first electron-transport material 122a, the second electron-transport material 132a, and the third light-emitting layer 115c in the structures in FIGS. 3A and 3B have an extremely high electron-transport property. There-fore, even in the case where a hole-transport layer is used to be shared by light-emitting layers, the element characteristics on the electron-transport layer side are not reduced or hardly reduced; accordingly a light-emitting element in which the plurality of light-emitting layers are balanced can be obtained.

The light-emitting elements in FIGS. 3A and 3B each have the structure in which the anode 101 provided in the lower portion is used to be shared by the first light-emitting layer 115a, the second light-emitting layer 115b, and the third light-emitting layer 115c; however, one embodiment of the present invention is not limited thereto. For example, it is possible to employ a structure in which anodes 101 having different thicknesses are respectively provided below the first light-emitting layer 115a, the second light-emitting layer 115b, and the third light-emitting layer 115c. For example, in the structure including anodes 101 having different thicknesses, the anode 101 of the first light-emitting layer 115a may have the largest thickness, that of the second light-emitting layer 115b may have the second largest thickness, and that of the third light-emitting layer 115c may have the smallest thickness.

Since the hole-transport layer 113 is used to be shared by the light-emitting layers in the light-emitting elements in FIGS. 3A and 3B, the structure in which the optical path is adjusted by the thickness of the anode 101 is one of structures that are effective in improving the element characteristics of each light-emitting layer.

This embodiment can be implemented in appropriate combination with any of the structures described in the other embodiments and examples.

[Embodiment 3]

In this embodiment, a light-emitting device manufactured using the light-emitting element of one embodiment of the present invention is described with reference to FIGS. 4A and 4B.

Figure 4A:
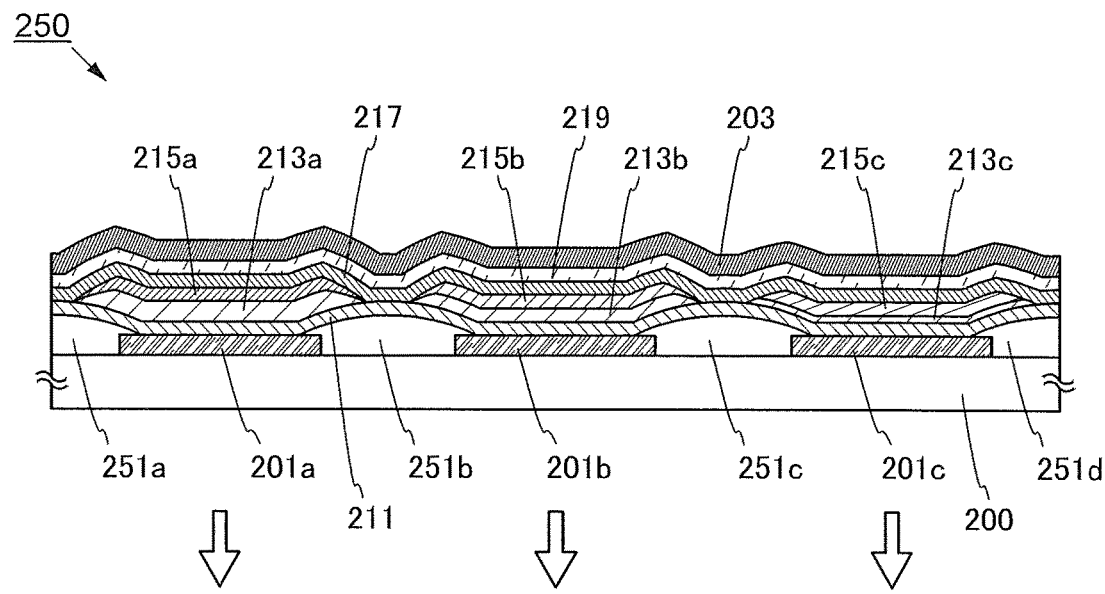
FIGS. 4A and 4B each illustrate a light-emitting device including a light-emitting element of one embodiment of the present invention.
Figure 4B:
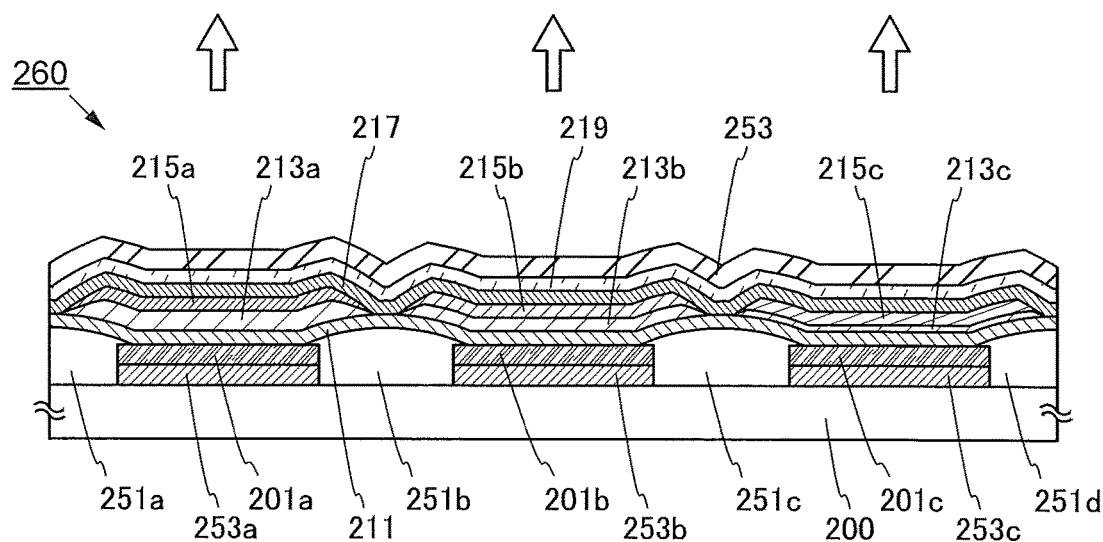

FIGS. 4A and 4B are cross-sectional views of light-emitting devices 250 and 260 in which first to third light-emitting layers are provided between an anode and a cathode.

First, the light-emitting device 250 illustrated in FIG. 4A is described below.

The light-emitting device 250 is what is called a bottom-emission light-emitting device in which light can be extracted from a substrate 200 side (a side indicated by arrows in FIG. 4A).

The light-emitting device 250 includes anodes 201a, 201b, and 201c that have shapes of separated islands, over the substrate 200. The material of the substrate 100 described in Embodiment 1 can be used for the substrate 200. The material of the anode 101 described in Embodiment 1 can be used for the anodes 201a, 201b, and 201c. The anodes 201a, 201b, and 201c may have different thicknesses depending on an emission color of the element. Further, since the light-emitting device 250 is a bottom-emission light-emitting device, the anodes 201a, 201b, and 201c are preferably formed using a material which transmits visible light (e.g., ITO).

The light-emitting device 250 includes partitions 251a, 251b, 251c, and 251d. The partition 251a covers one end portion of the anode 201a. The partition 251b covers the other end portion of the anode 201a and one end portion of the anode 201b. The partition 251c covers the other end portion of the anode 201b and one end portion of the anode 201c. The partition 251d covers the other end portion of the anode 201c. The partitions 251a, 251b, 251c, and 251d can be formed using an organic resin or an inorganic resin. As the organic resin, for example, a polyimide resin, a polyamide resin, an acrylic resin, a siloxane resin, an epoxy resin, a phenol resin, or the like can be used. As the inorganic insulating material, silicon oxide, silicon oxynitride, or the like can be used. In particular, a photosensitive resin is preferably used for easy formation of the partitions 251a, 251b, 251c, and 251d.

The light-emitting device 250 includes a hole-injection layer 211 over the anodes 201a, 201b, and 201c and the partitions 251a, 251b, 251c, and 251d. The material of the hole-injection layer 111 described in Embodiment 1 can be used for the hole-injection layer 211.

The light-emitting device 250 includes a first hole-transport layer 213a, a second hole-transport layer 213b, and a third hole-transport layer 213c which are separately provided over the hole-injection layer 211 to have island shapes. A first light-emitting layer 215a, a second light-emitting layer 215b, and a third light-emitting layer 215c are provided over the first hole-transport layer 213a, the second hole-transport layer 213b, and the third hole-transport layer 213c, respectively. The first hole-transport layer 213a, the second hole-transport layer 213b, the third hole-transport layer 213c, the first light-emitting layer 215a, the second light-emitting layer 215b, and the third light-emitting layer 215c can be respectively formed using the material of the first hole-transport layer 113a, that of the second hole-transport layer 113b, that of the third hole-transport layer 113c, that of the first light-emitting layer 115a, that of the second light-emitting layer 115b, and that of the third light-emitting layer 115c, which are described in Embodiment 1.

In a manner similar to the first light-emitting layer 115a in FIG. 1A, the first light-emitting layer 215a includes a first phosphorescent material, a first electron-transport material, and a first hole-transport material. In a manner similar to the second light-emitting layer 115b in FIG. 1A, the second light-emitting layer 215b includes a second phosphorescent material, a second electron-transport material, and a second hole-transport material. In a manner similar to the third light-emitting layer 115c in FIG. 1A, the third light-emitting layer 215c includes a fluorescent material and a third electron-transport material. Note that to avoid complexity of the drawing, the first phosphorescent material, the first electron-transport material, the first hole-transport material, the second phosphorescent material, the second electron-transport material, the second hole-transport material, the fluorescent material, and the third electron-transport material are not illustrated in FIG. 4A.

The light-emitting device 250 includes an electron-transport layer 217 over the first light-emitting layer 215a, the second light-emitting layer 215b, and the third light-emitting layer 215c. Further, an electron-injection layer 219 is provided over the electron-transport layer 217. Furthermore, a cathode 203 is provided over the electron-injection layer 219. The material of the electron-transport layer 117 described in Embodiment 1 can be used for the electron-transport layer 217. The material of the electron-injection layer 119 described in Embodiment 1 can be used for the electron-injection layer 219. The material of the cathode 103 described in Embodiment 1 can be used for the cathode 203. Since the light-emitting device 250 is a bottom-emission light-emitting device, the cathode 203 is preferably formed using a reflective material (e.g., aluminum).

Although FIG. 4A shows the example in which the anode is provided in the lower portion and the cathode is provided in the upper portion, one embodiment of the present invention is not limited thereto. For example, a structure in which the anode is provided in the upper portion and the cathode is provided in the lower portion may be employed. In this case, the stacking order of the hole-injection layer, the hole-transport layer, the light-emitting layer, the electron-injection layer, and the electron-transport layer, which are provided between the anode and the cathode, may be changed.

The first light-emitting layer 215a, the second light-emitting layer 215b, and the third light-emitting layer 215c of the light-emitting device 250 are in contact with the electron-transport layer 217. The triplet excitation energy level of the material forming the electron-transport layer 217 is lower than that of the electron-transport material included in the first light-emitting layer 215a and that of the second electron-transport material included in the light-emitting layer 215b. In this manner, even when the electron-transport layer is used to be shared by the light-emitting layers included in the light-emitting device 250, an optimal element structure is obtained and thus low driving voltage, high current efficiency, or long lifetime is achieved. Therefore, the light-emitting device 250 with low power consumption or long lifetime can be obtained. Further, since the electron-transport layer is used to be shared, the light-emitting device 250 with high productivity can be obtained.

Next, the light-emitting device 260 in FIG. 4B is described below.

The light-emitting device 260 is a modification example of the light-emitting device 250 and is what is called a top-emission light-emitting device in which light can be extracted from a side indicated by arrows in FIG. 4B.

The light-emitting device 260 includes reflective electrodes 253a, 253b, and 253c that have shapes of separated islands, over the substrate 200. Further, the light-emitting device 260 includes the anodes 201a, 201b, and 201c that have shapes of separated islands, over the reflective electrodes 253a, 253b, and 253c. Since the light-emitting device 260 is a top-emission light-emitting device, the reflective electrodes 253a, 253b, and 253c are preferably formed using a reflective material (e.g., aluminum or silver).

The light-emitting device 260 includes the partitions 251a, 251b, 251c, and 251d. The partition 251a covers one end portion of the reflective electrode 253a and one end portion of the anode 201a. The partition 251b covers the other end portion of the reflective electrode 253a, the other end portion of the anode 201a, one end portion of the reflective electrode 253b, and one end portion of the anode 201b. The partition 251c covers the other end portion of the reflective electrode 253b, the other end portion of the anode 201b, one end portion of the reflective electrode 253c, and one end portion of the anode 201c. The partition 251d covers the other end portion of the reflective electrode 253c and the other end portion of the anode 201c.

The light-emitting device 260 includes the hole-injection layer 211 over the anodes 201a, 201b, and 201c and the partitions 251a, 251b, 251c, and 251d.

The light-emitting device 260 includes the first hole-transport layer 213a, the second hole-transport layer 213b, and the third hole-transport layer 213c which are separately provided over the hole-injection layer 211 to have island shapes. The first light-emitting layer 215a, the second light-emitting layer 215b, and the third light-emitting layer 215c are provided over the first hole-transport layer 213a, the second hole-transport layer 213b, and the third hole-transport layer 213c, respectively.

Note that in a manner similar to the first light-emitting layer 115a in FIG. 1A, the first light-emitting layer 215a includes a first phosphorescent material, a first electron-transport material, and a first hole-transport material. In a manner similar to the second light-emitting layer 115b in FIG. 1A, the second light-emitting layer 215b includes a second phosphorescent material, a second electron-transport material, and a second hole-transport material. In a manner similar to the third light-emitting layer 115c in FIG. 1A, the third light-emitting layer 215c includes a fluorescent material and a third electron-transport material. Note that to avoid complexity of the drawing, the first phosphorescent material, the first electron-transport material, the first hole-transport material, the second phosphorescent material, the second electron-transport material, the second hole-transport material, the fluorescent material, and the third electron-transport material are not illustrated in FIG. 4B.

The light-emitting device 260 includes the electron-transport layer 217 over the first light-emitting layer 215a, the second light-emitting layer 215b, and the third light-emitting layer 215c. Further, the electron-injection layer 219 is provided over the electron-transport layer 217. Furthermore, a semi-transmissive and semi-reflective electrode 253 serving as a cathode is provided over the electron-injection layer 219. For example, the semi-transmissive and semi-reflective electrode 253 can be formed by stacking a thin metal film (preferably with a thickness of 20 nm or less, further preferably 10 nm or less) and a conductive metal oxide film. The thin metal film can be formed using a single layer or a stacked layer using silver, magnesium, an alloy containing such a metal material, or the like. Indium oxide ($In_2O_3$), tin oxide ($SnO_2$), zinc oxide (ZnO), ITO, an indium oxide-zinc oxide ($In_2O_3$—ZnO), or any of these metal oxide materials containing silicon oxide can be used as the conductive metal oxide.

Since the light-emitting device 260 is a top-emission light-emitting device, the light strength of a certain wavelength can be increased by providing a micro optical resonator (a microcavity) utilizing a resonant effect of light between the semi-transmissive and semi-reflective electrode 253 and the reflective electrodes 253a, 253b, and 253c. The function as a microcavity can be adjusted by a material provided between the reflective electrodes 253a, 253b, and 253c and the semi-transmissive and semi-reflective electrode 253, a light path length, and the like. For example, the light strength of a certain wavelength emitted from each light-emitting layer may be increased by adjusting the thicknesses of the anodes 201a, 201b, and 201c, the first hole-transport layer 213a, the second hole-transport layer 213b, and the third hole-transport layer 213c. Note that the example of the light-emitting device 260 in which the optical path length is adjusted by the thicknesses of the first hole-transport layer 213a, the second hole-transport layer 213b, and the third hole-transport layer 213c is described here.

Although FIG. 4B shows the example in which the anode is provided in the lower portion and the cathode is provided in the upper portion, one embodiment of the present invention is not limited thereto. For example, a structure in which the anode is provided in the upper portion and the cathode is provided in the lower portion may be employed. In this case, the stacking order of the hole-injection layer, the hole-transport layer, the light-emitting layer, the electron-injection layer, and the electron-transport layer, which are provided between the anode and the cathode, may be changed.

The first light-emitting layer 215a, the second light-emitting layer 215b, and the third light-emitting layer 215c of the light-emitting device 260 are in contact with the electron-transport layer 217. The triplet excitation energy level of the material forming the electron-transport layer 217 is lower than that of the electron-transport material included in the first light-emitting layer 215a and that of the second electron-transport material included in the second light-emitting layer 215b. In this manner, even when the electron-transport layer is used to be shared by the light-emitting layers included in the light-emitting device 260, an optimal element structure is obtained and thus low driving voltage, high current efficiency, or long lifetime is achieved. Therefore, the light-emitting device 260 with low power consumption or long lifetime can be obtained. Further, since the electron-transport layer is used to be shared, the light-emitting device 260 with high productivity can be obtained.

Although FIGS. 4A and 4B show the examples of the light-emitting devices 250 and 260 in which only the light-emitting element is formed over the substrate 200, one embodiment of the present invention is not limited thereto. For example, it is preferable to employ a structure in which a transistor (e.g., a TFT) is separately formed over the substrate 200 and the transistor is electrically connection to the anodes 201a, 201b, and 201c or the reflective electrodes 253a, 253b, and 253c.

Here, a method for manufacturing the light-emitting device 250 illustrated in FIG. 4A is described below.

First, a conductive film is formed over the substrate 200 and processed into a desired shape to form the anodes 201a, 201b, and 201c. Next, the partitions 251a, 251b, 251c, and 251d are formed over the substrate 200 and the anodes 201a, 201b, and 201c. Note that the anodes 201a, 201b, and 201c and the partitions 251a, 251b, 251c, and 251d are preferably formed using a manufacturing process of the transistor.

The structure of the transistor is not limited: a top-gate transistor may be used, or a bottom-gate transistor such as an inverted staggered transistor may be used. An n-channel transistor may be used and a p-channel transistor may also be used. In addition, there is no particular limitation on a material used for the transistor. For example, a transistor in which silicon or an oxide semiconductor such as an In—Ga—Zn-based metal oxide is used in a channel formation region can be employed.

Next, the hole-injection layer 211 is formed over the anodes 201a, 201b, and 201c, and the partitions 251a, 251b, 251c, and 251d. The anodes 201a, 201b, and 201c can be formed by an evaporation method (including a vacuum vapor deposition), a sputtering method, a coating method, or an inkjet method. The hole-injection layer 211 can be formed by an evaporation method (including a vacuum evaporation method), a transfer method, a printing method, an inkjet method, a coating method, or the like.

Then, the first hole-transport layer 213a is formed in contact with the hole-injection layer 211 to overlap the anode 201a. The first hole-transport layer 213a can be formed by an evaporation method (including a vacuum evaporation method), a transfer method, a printing method, an inkjet method, a coating method, or the like. In this embodiment, the first hole-transport layer 213a is formed over a desired region by an evaporation method using a deposition mask (also referred to as a metal mask, fine metal mask, or a shadow mask).

After that, the first light-emitting layer 215a is formed over the first hole-transport layer 213a. The first light-emitting layer 215a can be formed by an evaporation method (including a vacuum evaporation method), a transfer method, a printing method, an inkjet method, a coating method, or the like. In this embodiment, the first light-emitting layer 215a is formed over a desired region by an evaporation method using a deposition mask (also referred to as a metal mask, fine metal mask, or a shadow mask). Note that the first hole-transport layer 213a and the first light-emitting layer 215a are preferably formed successively using the same deposition mask.

Next, the second hole-transport layer 213b is formed in contact with the hole-injection layer 211 to overlap the anode 201b. The second hole-transport layer 213b can be formed in the same way as that of the first hole-transport layer 213a.

After that, the second light-emitting layer 215b is formed over the second hole-transport layer 213b. The second light-emitting layer 215b can be formed in the same way as that of the first light-emitting layer 215a. Note that the second hole-transport layer 213b and the second light-emitting layer 215b are preferably formed successively using the same deposition mask.

Next, the third hole-transport layer 213c is formed in contact with the hole-injection layer 211 to overlap the anode 201c. The third hole-transport layer 213c can be formed in the same way as that of the first hole-transport layer 213a.

After that, the third light-emitting layer 215c is formed over the third hole-transport layer 213c. The third light-emitting layer 215c can be formed in the same way as that of the first light-emitting layer 215a. Note that the third hole-transport layer 213c and the third light-emitting layer 215c are preferably formed successively using the same deposition mask.

Next, the electron-transport layer 217 is formed over the hole-injection layer 211, the first light-emitting layer 215a, the second light-emitting layer 215b, and the third light-emitting layer 215c, and then the electron-injection layer 219 is formed over the electron-transport layer 217. The electron-transport layer 217 and the electron-injection layer 219 are each can be formed by an evaporation method (including a vacuum evaporation method), a transfer method, a printing method, an inkjet method, a coating method, or the like.

Then, the cathode 203 is formed over the electron-injection layer 219. The cathode 203 can be formed by an evaporation method (including a vacuum vapor deposition), a sputtering method, a coating method, or an inkjet method.

In this manner, the light-emitting device 250 in FIG. 4A can be manufactured.

A step of forming the reflective electrodes 253a, 253b, and 253c below the anodes 201a, 201b, and 201c, and a step of forming the semi-transmissive and semi-reflective electrode 253 instead of the cathode 203 are added to the manufacturing process of the light-emitting device 250, whereby the light-emitting device 260 in FIG. 4B can be formed.

This embodiment can be implemented in appropriate combination with any of the structures described in the other embodiments and examples.

[Embodiment 4]

In this embodiment, examples of a variety of electronic devices and lighting devices that are each completed by use of a light-emitting element or light-emitting device of one embodiment of the present invention are described with reference to FIGS. 5A to 5E.

Examples of electronic devices are a television device (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-size game machine such as a pachinko machine, and the like.

An electronic device or a lighting device that has a light-emitting portion with a curved surface can be obtained with the use of the light-emitting element of one embodiment of the present invention, which is manufactured over a substrate having flexibility.

In addition, an electronic device or a lighting device that has a see-through light-emitting portion can be obtained with the use of the light-emitting element of one embodiment of the present invention, in which a pair of electrodes are formed using a material having a property of transmitting visible light.

Further, a light-emitting device to which one embodiment of the present invention is applied can also be applied to lighting for motor vehicles, examples of which are lighting for a dashboard, a windshield, a ceiling, and the like.

Figure 5A:
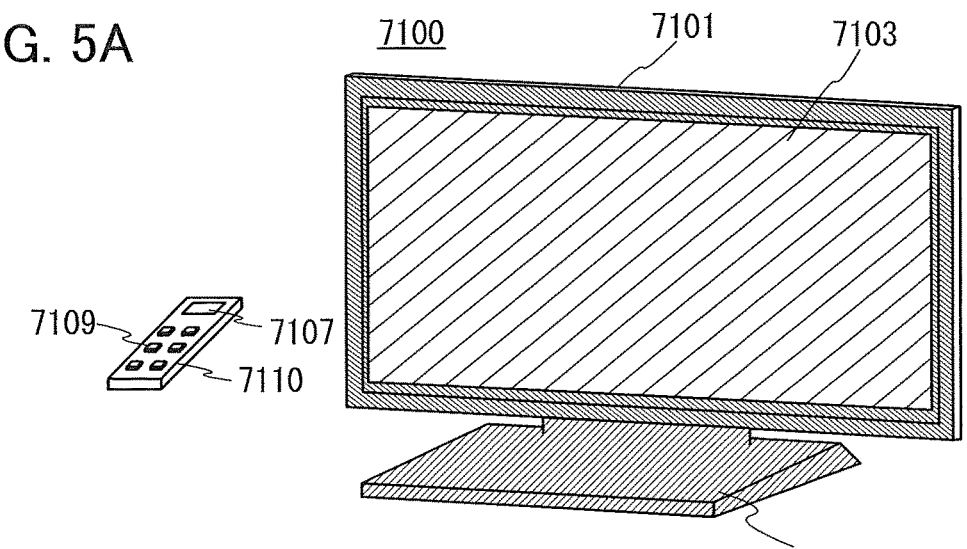
FIGS. 5A to 5E illustrate electronic appliances including a light-emitting element and a light-emitting device of one embodiment of the present invention.

FIG. 5A illustrates an example of a television device. In a television device 7100, a display portion 7103 is incorporated in a housing 7101. Images can be displayed by the display portion 7103, and the light-emitting device can be used for the display portion 7103. In addition, here, the housing 7101 is supported by a stand 7105.

The television device 7100 can be operated by an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the use of the receiver, general television broadcasting can be received. Moreover, when the television device is connected to a communication network with or without wires via the modem, one-way (from a sender to a receiver) or two-way (between a sender and a receiver or between receivers) information communication can be performed.

Figure 5B:
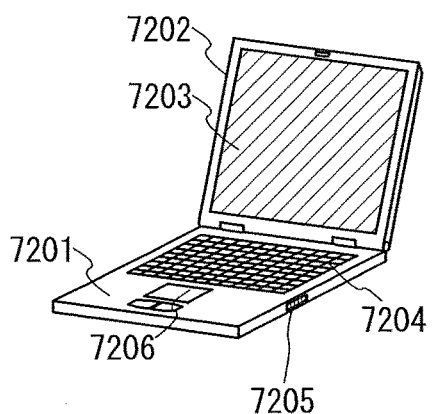

FIG. 5B illustrates a computer, which includes a main body 7201, a housing 7202, a display portion 7203, a keyboard 7204, an external connection port 7205, a pointing device 7206, and the like. Note that this computer is manufactured using the light-emitting device for the display portion 7203.

Figure 5C:
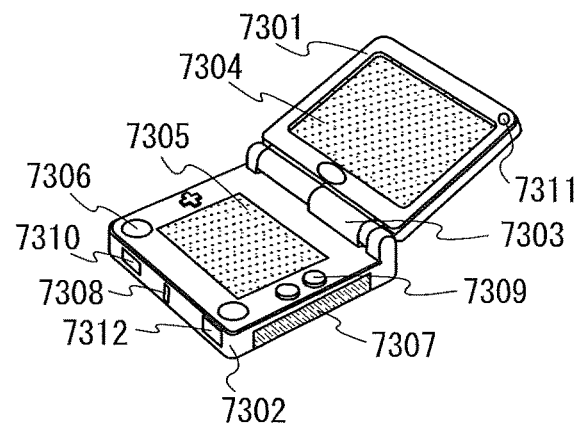

FIG. 5C illustrates a portable game machine having two housings, a housing 7301 and a housing 7302, which are connected with a joint portion 7303 so that the portable game machine can be opened or folded. A display portion 7304 is incorporated in the housing 7301 and a display portion 7305 is incorporated in the housing 7302. In addition, the portable game machine illustrated in FIG. 5C includes a speaker portion 7306, a recording medium insertion portion 7307, an LED lamp 7308, input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 7312), and the like. It is needless to say that the structure of the portable game machine is not limited to the above as long as a light-emitting device is used for at least either the display portion 7304 or the display portion 7305, or both, and may include other accessories as appropriate. The portable game machine illustrated in FIG. 5C has a function of reading out a program or data stored in a storage medium to display it on the display portion, and a function of sharing information with another portable game machine by wireless communication. The portable game machine illustrated in FIG. 5C can have a variety of functions without limitation to the above.

Figure 5D:
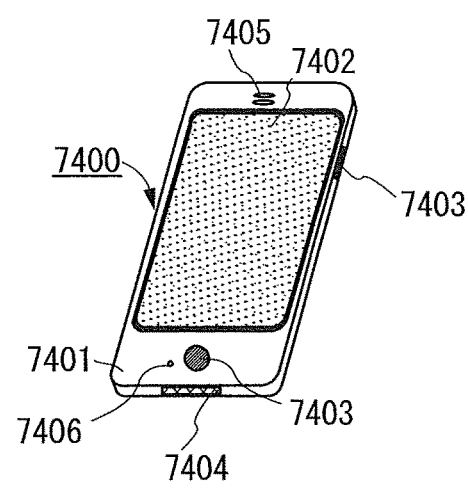

FIG. 5D illustrates an example of a mobile phone. A mobile phone 7400 is provided with a display portion 7402 incorporated in a housing 7401, an operation button 7403, an external connection port 7404, a speaker 7405, a microphone 7406, and the like. Note that the mobile phone 7400 is manufactured using a light-emitting device for the display portion 7402.

When the display portion 7402 of the mobile phone 7400 illustrated in FIG. 5D is touched with a finger or the like, data can be input into the mobile phone 7400. Further, operations such as making a call and creating an e-mail can be performed by touching the display portion 7402 with a finger or the like.

There are mainly three screen modes of the display portion 7402. The first mode is a display mode mainly for displaying an image. The second mode is an input mode mainly for inputting data such as characters. The third mode is a display-and-input mode in which two modes of the display mode and the input mode are combined.

For example, in the case of making a call or creating e-mail, a character input mode mainly for inputting characters is selected for the display portion 7402 so that characters displayed on the screen can be input. In this case, it is preferable to display a keyboard or number buttons on almost the entire screen of the display portion 7402.

When a detection device including a sensor for detecting inclination, such as a gyroscope or an acceleration sensor, is provided inside the mobile phone 7400, display on the screen of the display portion 7402 can be automatically changed by determining the orientation of the mobile phone 7400 (whether the mobile phone is placed horizontally or vertically for a landscape mode or a portrait mode).

The screen modes are changed by touch on the display portion 7402 or operation with the operation button 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, if a signal detected by an optical sensor in the display portion 7402 is detected and the input by touch on the display portion 7402 is not performed for a certain period, the screen mode may be controlled so as to be changed from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, when a backlight or a sensing light source which emits near-infrared light is provided in the display portion, an image of a finger vein, a palm vein, or the like can be taken.

Figure 5E:
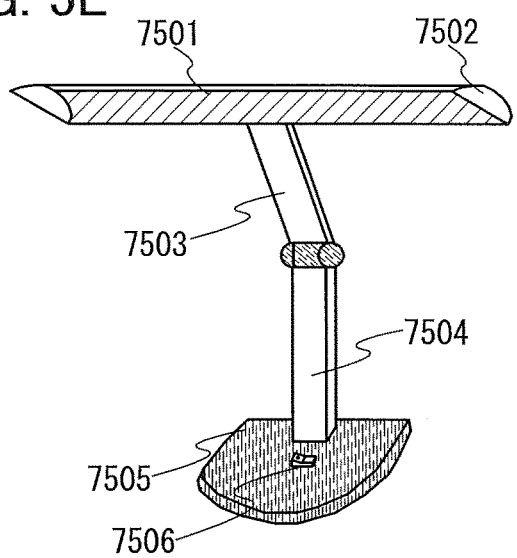

FIG. 5E illustrates a desk lighting device including a lighting portion 7501, a shade 7502, an adjustable arm 7503, a support 7504, a base 7505, and a power switch 7506. The desk lighting device is manufactured using the light-emitting device for the lighting portion 7501. Note that a lighting device includes a ceiling light, a wall light, and the like in its category.

This embodiment can be implemented in appropriate combination with any of the structures described in the other embodiments and examples.

EXAMPLE 1

In this embodiment, the triplet excitation energy levels (T1 levels) of 9-[4-(10-phenyl-9-anthracenyl)phenyl]-9H-carbazole (abbreviation: CzPA), which can be used for an electron-transport layer of a light-emitting element of one embodiment of the present invention, and 2-[3'-(dibenzothiophen-4-yl)biphenyl-3-yl]dibenzo[f,h]quinoxaline (abbreviation: 2mDBTBPDBq-II), which can be used as a host material (a first electron-transport material and a second electron-transport material) of a phosphorescent element, were measured. Chemical formulae of materials used in this example are shown below.

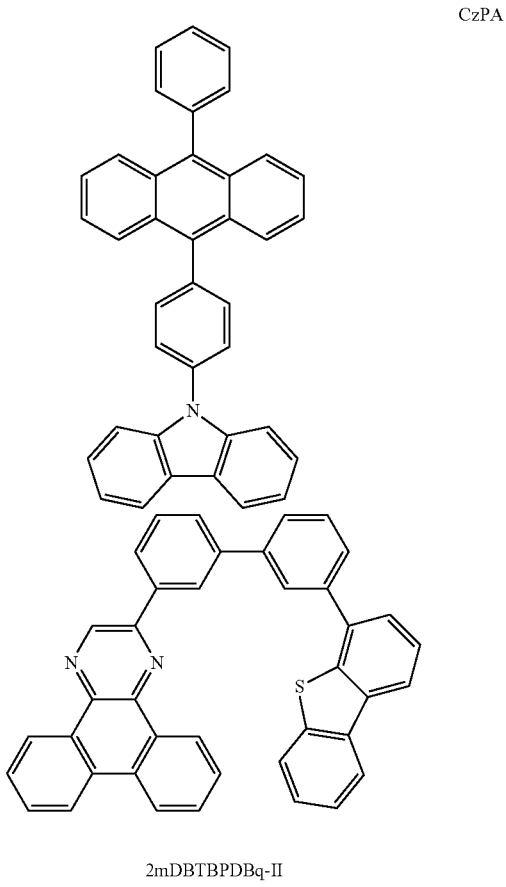

Note that the T1 levels were obtained by measurement of emission of phosphorescence from the substances. In the measurement, each substance was irradiated with excitation light with a wavelength of 325 nm and the measurement temperature was 10 K. Further, 2mDBTBPDBq-II was subjected to time-resolved measurement using mechanical choppers. It is difficult to apply time-resolved measurement to CzPA; therefore, Ir(ppy)$_3$ was added as a sensitizer and CzPA was measured without time resolving. As the measurement condition, the weight ratio of CzPA to Ir(ppy)$_3$ was 3:1. Note that in measuring a triplet excitation energy level, calculation from an absorption wavelength is more accurate than calculation from an emission wavelength. However, here, absorption of the T1 level was extremely low and measuring it is difficult; thus, the T1 level was measured by measuring an emission wavelength. For that reason, a few errors may be included in the measured values. Table 1 shows the measurement results.

TABLE 1

| Substance | T1 level |
|---|---|
| CzPA | 1.72 eV |
| 2mDBTBPDBq-II | 2.41 eV |

Table 1 shows that the triplet excitation energy level of CzPA which can be used for an electron-transport layer is lower by 0.69 eV than that of 2mDBTBPDBq-II which can be used as a host material (a first electron-transport material and a second electron-transport material) of a phosphorescent element.

EXAMPLE 2

Figure 6A:
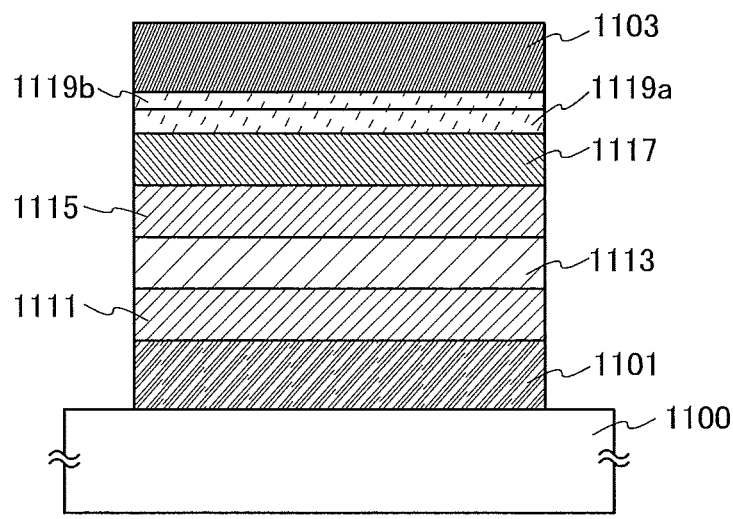
FIGS. 6A and 6B illustrate light-emitting elements of Examples.

In this example, light-emitting elements (light-emitting elements 1, 3, and 5) of one embodiment of the present invention and light-emitting elements for comparison (comparative light-emitting elements 2, 4, and 6) are described with reference to FIG. 6A. Chemical formulae of materials used in this example are shown below.

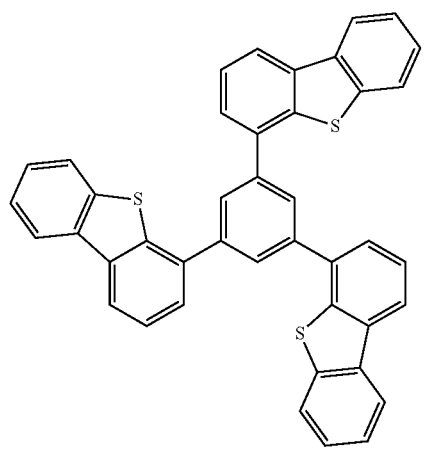

DBT3P-II

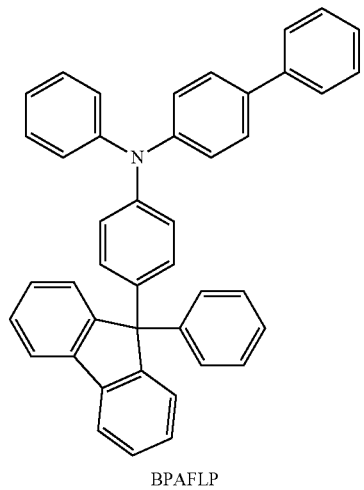

BPAFLP

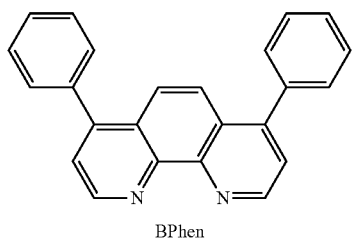

BPhen

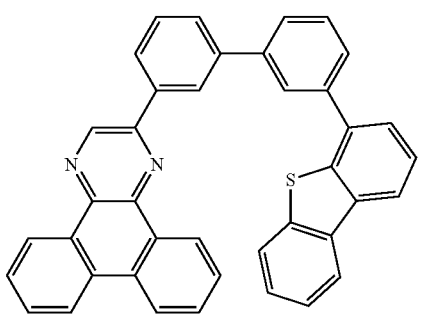

2mDBTBPDBq-II

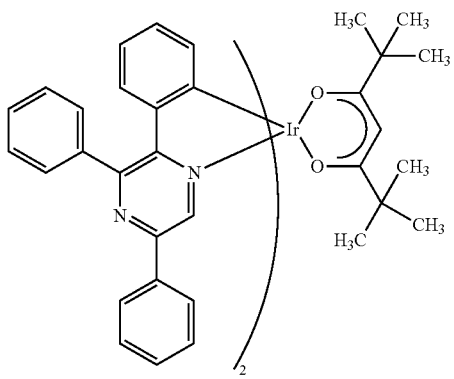

Ir(tppr)₂(dpm)

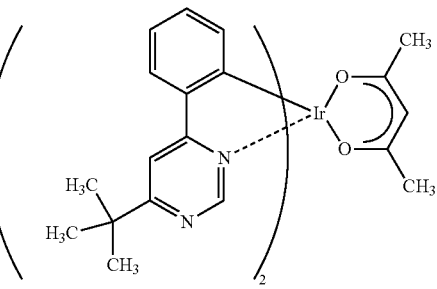

Ir(tBuppm)₂(acac)

-continued

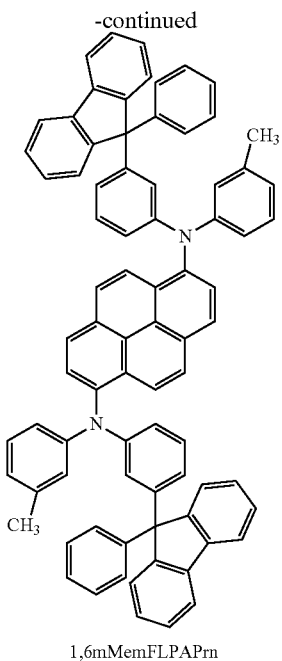

1,6mMemFLPAPrn

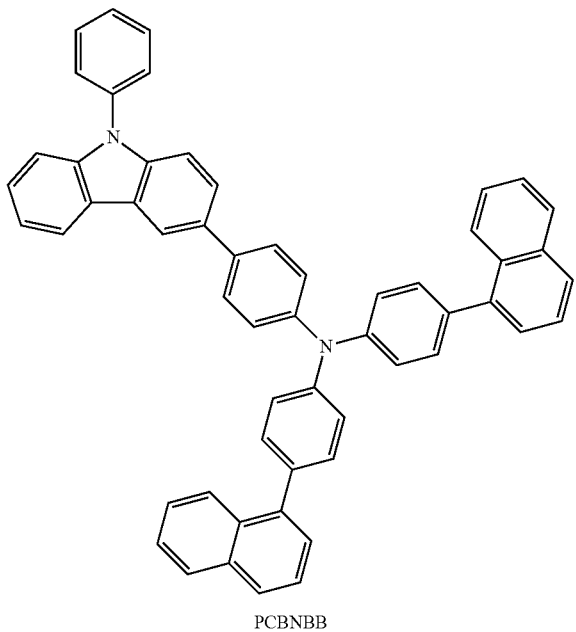

PCBNBB

Methods for manufacturing the light-emitting elements (the light-emitting elements 1, 3, and 5) of one embodiment of the present invention and the comparative light-emitting elements (the comparative light-emitting elements 2, 4, and 6), which are used in this example, are described below.

Note that the light-emitting element 1 and the comparative light-emitting element 2 are red-light-emitting elements, the light-emitting element 3 and the comparative light-emitting element 4 are green-light-emitting elements, and the light-emitting element 5 and the comparative light-emitting element 6 are blue-light-emitting elements.

(Light-Emitting Element 1)

First, an indium oxide-tin oxide compound containing silicon or silicon oxide (ITO-SiO$_2$, hereinafter abbreviated to ITSO) was deposited over a substrate 1100 by a sputtering method, whereby an anode 1101 was formed. Note that the composition ratio of In$_2$O$_3$ to SnO$_2$ and SiO$_2$ in the target used was 85:10:5 [wt %]. The thickness of the anode 1101 was 110 nm and the electrode area was 2 mm×2 mm.

Next, as pretreatment for forming the light-emitting element over the substrate 1100, the surface of the substrate was washed, baked at 200° C. for one hour, and subjected to UV ozone treatment for 370 seconds.

After that, the substrate 1100 was transferred into a vacuum evaporation apparatus where the pressure had been reduced to approximately 10$^{-4}$ Pa, and subjected to vacuum baking at 170° C. for 30 minutes in a heating chamber of the vacuum evaporation apparatus, and then the substrate 1100 was cooled down for about 30 minutes.

Then, the substrate 1100 over which the anode 1101 was formed was fixed to a substrate holder provided in a vacuum evaporation apparatus so that the surface on which the anode 1101 was formed faced downward. The pressure in the vacuum evaporation apparatus was reduced to about 10$^{-4}$ Pa. After that, on the anode 1101, by an evaporation method using resistance heating, 4,4',4''-(benzene-1,3,5-triyl)tri (dibenzothiophene) (abbreviation: DBT3P-II) and molybdenum oxide were co-evaporated, whereby a hole-injection layer 1111 was formed. The thickness was set to 40 nm, and the weight ratio of DBT3P-II to molybdenum oxide was adjusted to 4:2 (=DBT3P-II: molybdenum oxide). Note that the co-evaporation method refers to an evaporation method in which evaporation is carried out from a plurality of evaporation sources at the same time in one treatment chamber.

Next, 4-phenyl-4'-(9-phenylfluoren-9-yl)triphenylamine (abbreviation: BPAFLP) was deposited to a thickness of 20 nm over the hole-injection layer 1111, whereby a hole-transport layer 1113 was formed.

Next, 2mDBTBPDBq-II, 4,4'-di(1-naphthyl)-4''-(9-phenyl-9H-carbazol-3-yl)-triphenylamine (abbreviation: PCBNBB), and (dipivaloylmethanato)bis(2,3,5-triphenylpyrazinato)iridium(III) (abbreviation: Ir(tppr)$_2$(dpm)) were co-evaporated to form a light-emitting layer 1115 over the hole-transport layer 1113. Here, the weight ratio of 2mDBTBPDBq-II, PCBNBB, and Ir(tppr)$_2$(dpm) was adjusted to 0.8:0.2:0.06 (=2mDBTBPDBq-II:PCBNBB:Ir(tppr)$_2$(dpm)). The thickness of the light-emitting layer 1115 was 40 nm.

In the light-emitting layer 1115, 2mDBTBPDBq-II, which is an electron-transport material, functions as a host material. Further, PCBNBB, which is a hole-transport material, functions as an assist material. Furthermore, Ir(tppr)$_2$(dpm), which is an organometallic complex containing iridium, functions as a guest material.

Further, CzPA was deposited to a thickness of 10 nm over the light-emitting layer 1115, whereby an electron-transport layer 1117 was formed.

After that, on the electron-transport layer 1117, bathophenanthroline (abbreviation: BPhen) was deposited to a thickness of 15 nm to form a first electron-injection layer 1119*a*.

Further, lithium fluoride (LiF) was evaporated to a thickness of 1 nm on the first electron-injection layer 1119*a*, so that a second electron-injection layer 1119*b* was formed.

Lastly, on the second electron-injection layer 1119*b*, aluminum was evaporated to a thickness of 200 nm as a cathode 1103. Thus, the light-emitting element 1 of this example was formed.

(Comparative Light-Emitting Element 2)

The comparative light-emitting element 2 is different from the light-emitting element 1 in the electron-transport layer 1117. Specifically, instead of CzPA, which was used in the light-emitting element 1, 2mDBTBPDBq-II was used for the electron-transport layer 1117 of the comparative light-emitting element 2. Note that the thickness of 2mDBTBP-DBq-II was 10 nm.

The comparative light-emitting element 2 was formed in a manner similar to that of the light-emitting element 1 except the structure of the electron-transport layer 1117.

(Light-Emitting Element 3)

The light-emitting element 3 is different from the light-emitting element 1 in the light-emitting layer 1115. Specifically, instead of 2mDBTBPDBq-II, PCBNBB, and Ir(tppr)$_2$(dpm), which were used for the light-emitting element 1, 2mDBTBPDBq-II, PCBNBB, and (acetylacetonato)bis(6-tert-butyl-4-phenylpyrimidinato)iridium(III) (abbreviation: Ir(tBuppm)$_2$(acac)) were used for the light-emitting layer 1115 of the light-emitting element 3.

The light-emitting layer 1115 of the light-emitting element 3 was formed by co-evaporation of 2mDBTBPDBq-II, PCBNBB, and Ir(tBuppm)$_2$(acac). Here, the weight ratio of 2mDBTBPDBq-II, PCBNBB and Ir(tBuppm)$_2$(acac) was adjusted to 0.8:0.2:0.06 (=2mDBTBPDBq-II:PCBNBB: Ir(tBuppm)$_2$(acac)). The thickness of the light-emitting layer 1115 of the light-emitting element 3 was 40 nm.

In the light-emitting layer 1115 of the light-emitting element 3, 2mDBTBPDBq-II, which is an electron-transport material, functions as a host material. Further, PCBNBB, which is a hole-transport material, functions as an assist material. Furthermore, Ir(tBuppm)$_2$(acac), which is an organometallic complex containing iridium, functions as a guest material.

The components of the light-emitting element 3 other than the light-emitting layer 1115 were formed in a manner similar to those of the light-emitting element 1.

(Comparative Light-Emitting Element 4)

The comparative light-emitting element 4 is different from the light-emitting element 1 in the light-emitting layer 1115 and the electron-transport layer 1117. Specifically, instead of 2mDBTBPDBq-II, PCBNBB, and Ir(tppr)$_2$(dpm), which were used for the light-emitting element 1, 2mDBTBPDBq-II, PCBNBB, and Ir(tBuppm)$_2$(acac) were used for the light-emitting layer 1115 of the comparative light-emitting element 4. In addition, instead of CzPA used for the light-emitting element 1, 2mDBTBPDBq-II was used for the electron-transport layer 1117 of the comparative light-emitting element 4.

The light-emitting layer 1115 of the comparative light-emitting element 4 was formed by co-evaporation of 2mDBTBPDBq-II, PCBNBB, and Ir(tBuppm)$_2$(acac). Here, the weight ratio of 2mDBTBPDBq-II, PCBNBB and Ir(tBuppm)$_2$(acac) was adjusted to 0.8:0.2:0.06 (=2mDBT-BPDBq-II:PCBNBB: Ir(tBuppm)$_2$(acac)). The thickness of the light-emitting layer 1115 of the comparative light-emitting element 4 was 40 nm.

The thickness of the electron-transport layer 1117 of the comparative light-emitting element 4 was 10 nm.

The components other than the light-emitting layer 1115 and the electron-transport layer 1117 of the comparative light-emitting element 4 were formed in a manner similar to those of the light-emitting element 1.

(Light-Emitting Element 5)

The light-emitting element 5 is different from the light-emitting element 1 in the light-emitting layer 1115. Specifically, instead of 2mDBTBPDBq-II, PCBNBB, and Ir(tppr)$_2$(dpm), which were used for the light-emitting element 1, CzPA and N,N'-bis[3-(9-phenyl-9H-fluoren-9-yl)phenyl]-pyrene-1,6-diamine (abbreviation 1,6mMemFLPA-Prn) were used for the light-emitting layer 1115 of the light-emitting element 5.

The light-emitting layer 1115 of the light-emitting element 5 was formed by co-evaporation of CzPA and 1,6mMemFLPAPm. Here, the weight ratio of CzPA and 1,6mMemFLPAPrn was adjusted to 1:0.05 (=CzPA:1, 6mMemFLPAPrn). The thickness of the light-emitting layer 1115 of the light-emitting element 5 was 25 nm.

In the light-emitting layer 1115 of the light-emitting element 5, CzPA, which is an electron-transport material, functions as a host material. Further, 1,6mMemFLPAPrn, which is a fluorescent material, functions as a guest material.

The components of the light-emitting element 5 other than the light-emitting layer 1115 were formed in a manner similar to those of the light-emitting element 1.

(Comparative Light-Emitting Element 6)

The comparative light-emitting element 6 is different from the light-emitting element 1 in the light-emitting layer 1115 and the electron-transport layer 1117. Specifically, instead of 2mDBTBPDBq-II, PCBNBB, and Ir(tppr)$_2$(dpm), which were used for the light-emitting element 1, CzPA and 1,6mMemFLPAPrn were used for the light-emitting layer 1115 of the comparative light-emitting element 6. In addition, instead of CzPA used for the light-emitting element 1, 2mDBTBPDBq-II was used for the electron-transport layer 1117 of the comparative light-emitting element 6.

The light-emitting layer 1115 of the comparative light-emitting element 6 was formed by co-evaporation of CzPA and 1,6mMemFLPAPm. Here, the weight ratio of CzPA and 1,6mMemFLPAPm was adjusted to 1:0.05 (=CzPA:1, 6mMemFLPAPrn). The thickness of the light-emitting layer 1115 of the comparative light-emitting element 6 was 25 nm.

In the light-emitting layer 1115 of the comparative light-emitting element 6, CzPA, which is an electron-transport material, functions as a host material. Further, 1,6mMem-FLPAPrn, which is a fluorescent material, functions as a guest material.

The thickness of the electron-transport layer 1117 of the comparative light-emitting element 6 was 10 nm.

The components other than the light-emitting layer 1115 and the electron-transport layer 1117 of the comparative light-emitting element 6 were formed in a manner similar to those of the light-emitting element 1.

The evaporation process of each of the light-emitting elements (the light-emitting elements 1, 3, and 5) of one embodiment of the present invention and the comparative light-emitting elements (the comparative light-emitting elements 2, 4, and 6) is performed by a resistance-heating method.

As described above, the light-emitting elements (the light-emitting elements 1, 3, and 5) of one embodiment of the present invention and the comparative light-emitting elements (the comparative light-emitting elements 2, 4, and 6) have the same structure except the structures of the light-emitting layer 1115 and the electron-transport layer 1117.

Table 2 shows the element structures of the light-emitting elements (the light-emitting elements 1, 3, and 5) of one embodiment of the present invention and the comparative light-emitting elements (the comparative light-emitting elements 2, 4, and 6) obtained in the above manner.

TABLE 2

| | Anode | Hole-injection layer | Hole-transport layer | Light-emitting layer | Electron-transport layer | First electron-injection layer | Second electron-injection layer | Cathode | Note |
|---|---|---|---|---|---|---|---|---|---|
| Light-emitting element 1 | ITSO 110 nm | DBT3P-II:MoO$_x$ (=4:2) 40 nm | BPAFLP 20 nm | See below | See below | BPhen 15 nm | LiF 1 nm | Al 200 nm | Red-light-emitting element |
| Comparative light-emitting element 2 | ITSO 110 nm | DBT3P-II:MoO$_x$ (=4:2) 40 nm | BPAFLP 20 nm | See below | See below | BPhen 15 nm | LiF 1 nm | Al 200 nm | Red-light-emitting element |
| Light-emitting element 3 | ITSO 110 nm | DBT3P-II:MoO$_x$ (=4:2) 40 nm | BPAFLP 20 nm | See below | See below | BPhen 15 nm | LiF 1 nm | Al 200 nm | Green-light-emitting element |
| Comparative light-emitting element 4 | ITSO 110 nm | DBT3P-II:MoO$_x$ (=4:2) 40 nm | BPAFLP 20 nm | See below | See below | BPhen 15 nm | LiF 1 nm | Al 200 nm | Green-light-emitting element |
| Light-emitting element 5 | ITSO 110 nm | DBT3P-II:MoO$_x$ (=4:2) 40 nm | BPAFLP 20 nm | See below | See below | BPhen 15 nm | LiF 1 nm | Al 200 nm | Blue-light-emitting element |
| Comparative light-emitting element 6 | ITSO 110 nm | DBT3P-II:MoO$_x$ (=4:2) 40 nm | BPAFLP 20 nm | See below | See below | BPhen 15 nm | LiF 1 nm | Al 200 nm | Blue-light-emitting element |

| | Light-emitting layer | Electron-transport layer |
|---|---|---|
| Light-emitting element 1 | 2mDBTBPDBq-II:PCBNBB:Ir(tppr)$_2$dpm (=0.8:0.2:0.06) 40 nm | CzPA 10 nm |
| Comparative light-emitting element 2 | 2mDBTBPDBq-II:PCBNBB:Ir(tppr)$_2$dpm (=0.8:0.2:0.06) 40 nm | 2mDBTBPDBq-II 10 nm |
| Light-emitting element 3 | 2mDBTBPDBq-II:PCBNBB:Ir(tBuppm)$_2$(acac) (=0.8:0.2:0.06) 40 nm | CzPA 10 nm |
| Comparative light-emitting element 4 | 2mDBTBPDBq-II:PCBNBB:Ir(tBuppm)$_2$(acac) (=0.8:0.2:0.06) 40 nm | 2mDBTBPDBq-II 10 nm |
| Light-emitting element 5 | CzPA:1,6mMemFLPAPm (=1:0.05) 25 nm | CzPA 10 nm |
| Comparative light-emitting element 6 | CzPA:1,6mMemFLPAPm (=1:0.05) 25 nm | 2mDBTBPDBq-II 10 nm |

As shown in Table 2, as for the light-emitting elements of one embodiment of the present invention, 2mDBTBPDBq-II is used as host materials of phosphorescent materials (of the light-emitting elements 1 and 3) and CzPA is used as a host material of a fluorescent (of the light-emitting element 5). Further, the same CzPA is used as the electron-transport layers of the light-emitting elements 1, 3, and 5. On the other hand, as for the comparative light-emitting elements, 2mDBTBPDBq-II is used as host materials of phosphorescent materials (of the comparative light-emitting elements 2 and 4) and CzPA is used as a host material of a fluorescent material (of the light-emitting element 6). The same 2mDBTBPDBq-II is used for the electron-transport layers of the comparative light-emitting elements 2, 4, and 6.

Next, in a glove box containing a nitrogen atmosphere, the light-emitting elements formed as described above were sealed with a glass substrate so as not to be exposed to the air (specifically, a sealant was applied onto an outer edge of the element and heat treatment was performed at 80° C. for one hour at the time of sealing). Then, the operation characteristics of the light-emitting elements were measured. It is to be noted that the measurements were performed at room temperature (in an atmosphere kept at 25° C.).

Figure 7:
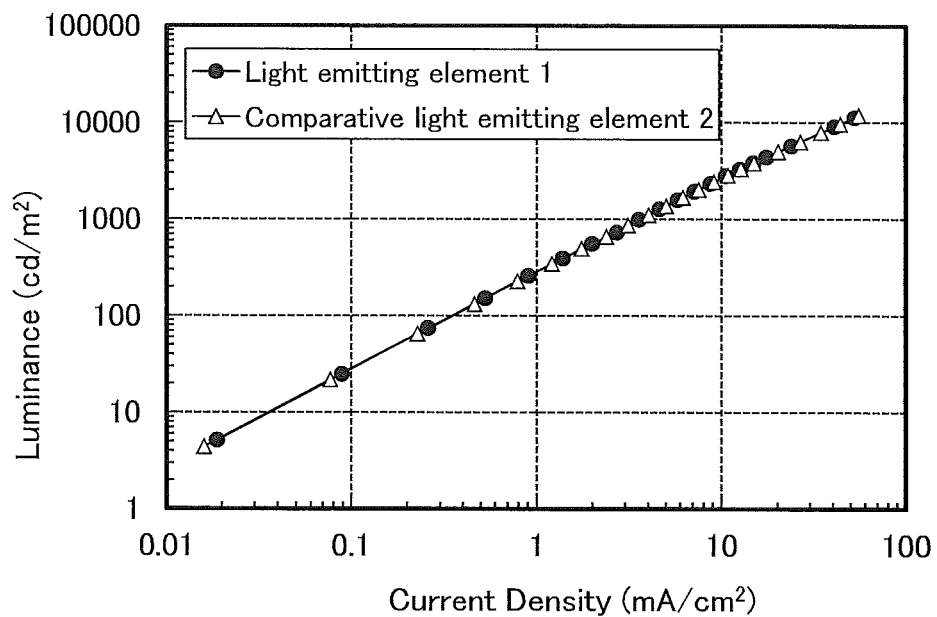
FIG. 7 is a graph showing current density-luminance characteristics of a light-emitting element 1 and a comparative light-emitting element 2.
Figure 8:
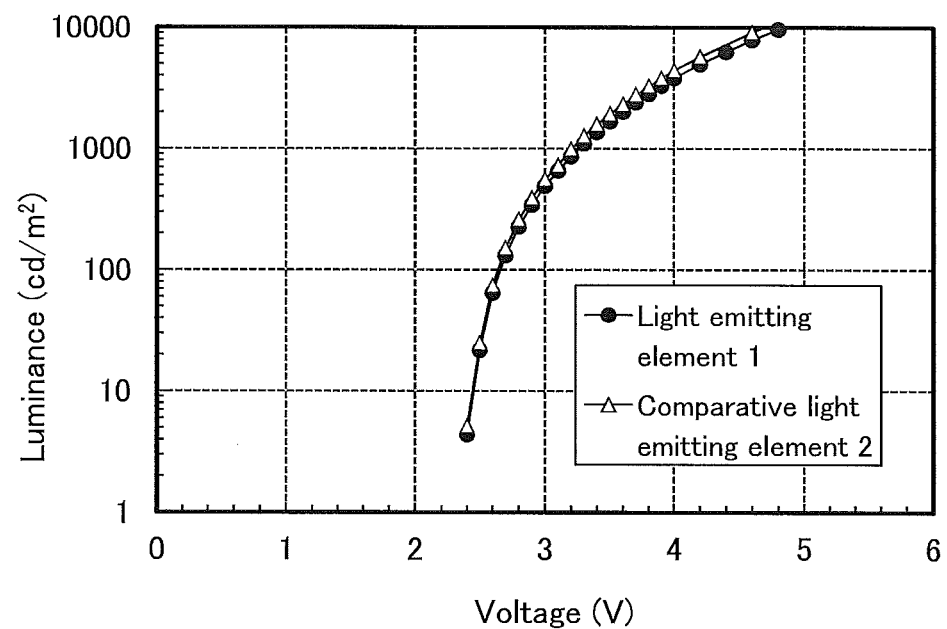
FIG. 8 is a graph showing voltage-luminance characteristics of a light-emitting element 1 and a comparative light-emitting element 2.
Figure 9:
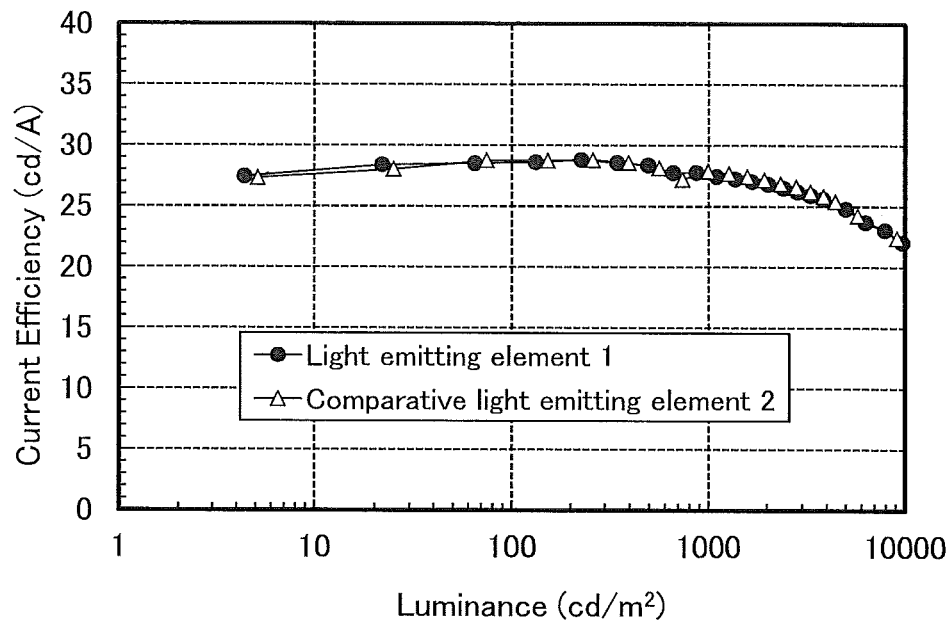
FIG. 9 is a graph showing luminance-current efficiency characteristics of a light-emitting element 1 and a comparative light-emitting element 2.
Figure 10:
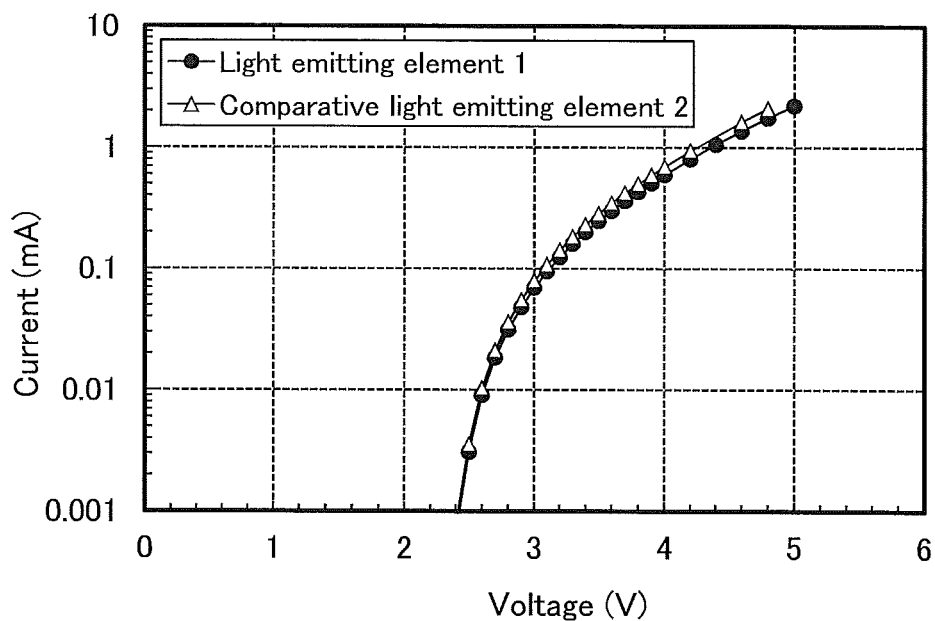
FIG. 10 is a graph showing voltage-current characteristics of a light-emitting element 1 and a comparative light-emitting element 2.
Figure 11:
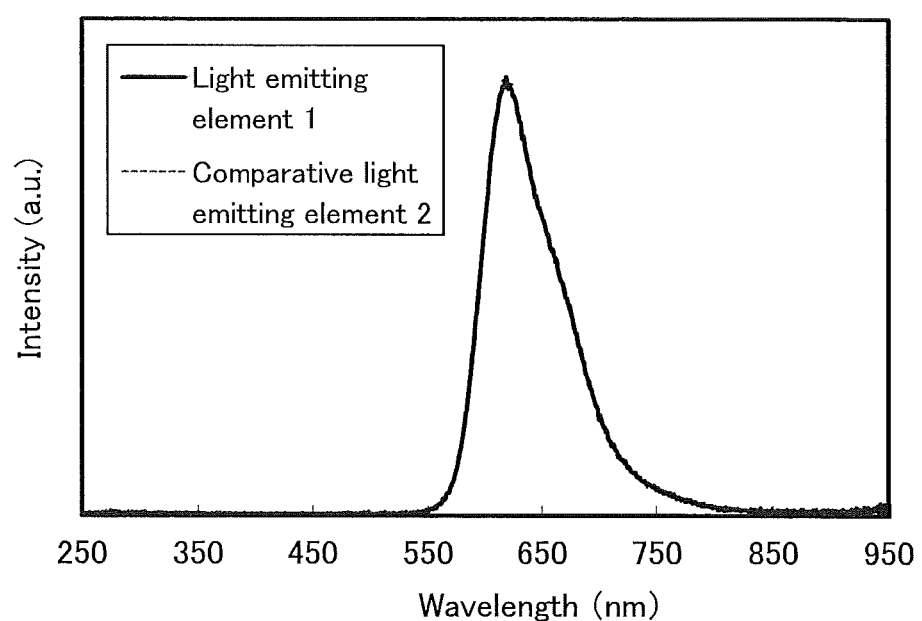
FIG. 11 is a graph showing emission spectra of a light-emitting element 1 and a comparative light-emitting element 2.
Figure 12:
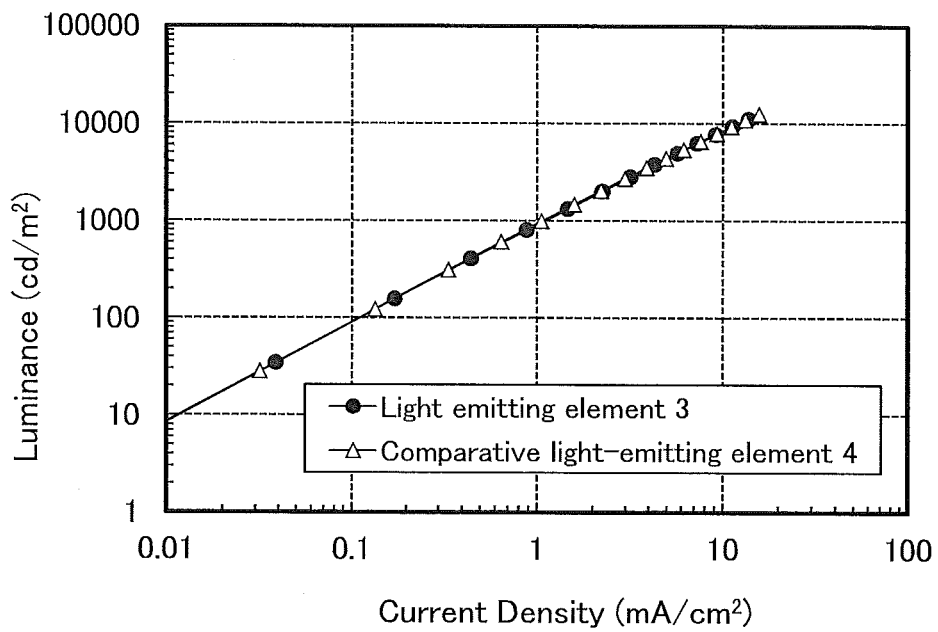
FIG. 12 is a graph showing current density-luminance characteristics of a light-emitting element 3 and a comparative light-emitting element 4.
Figure 13:
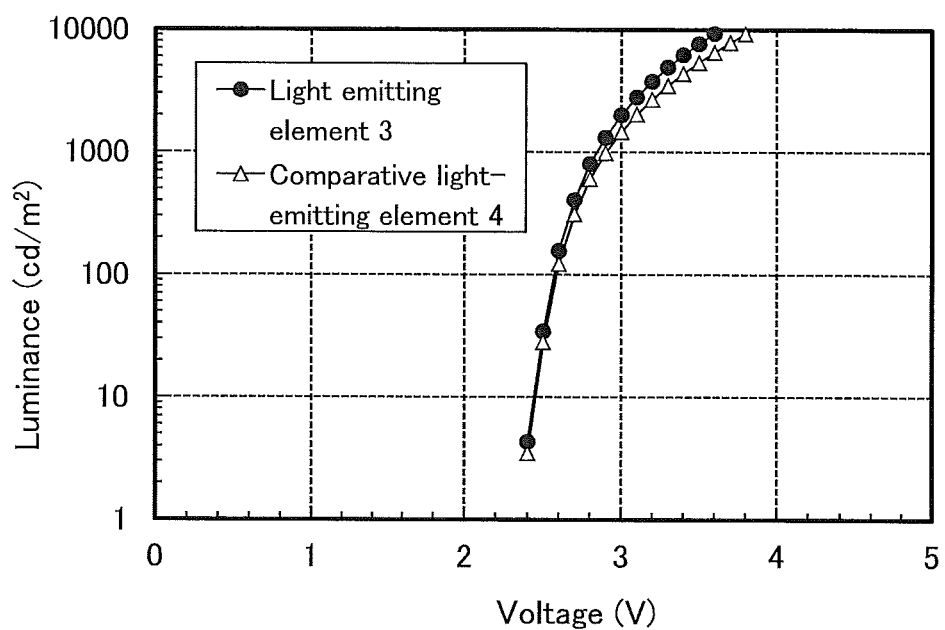
FIG. 13 is a graph showing voltage-luminance characteristics of a light-emitting element 3 and a comparative light-emitting element 4.
Figure 14:
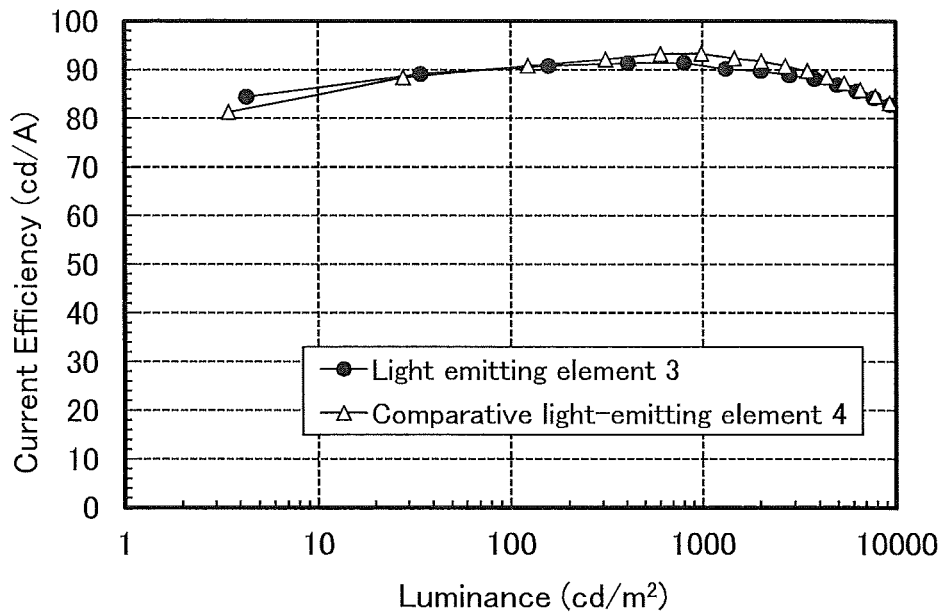
FIG. 14 is a graph showing luminance-current efficiency characteristics of a light-emitting element 3 and a comparative light-emitting element 4.
Figure 15:
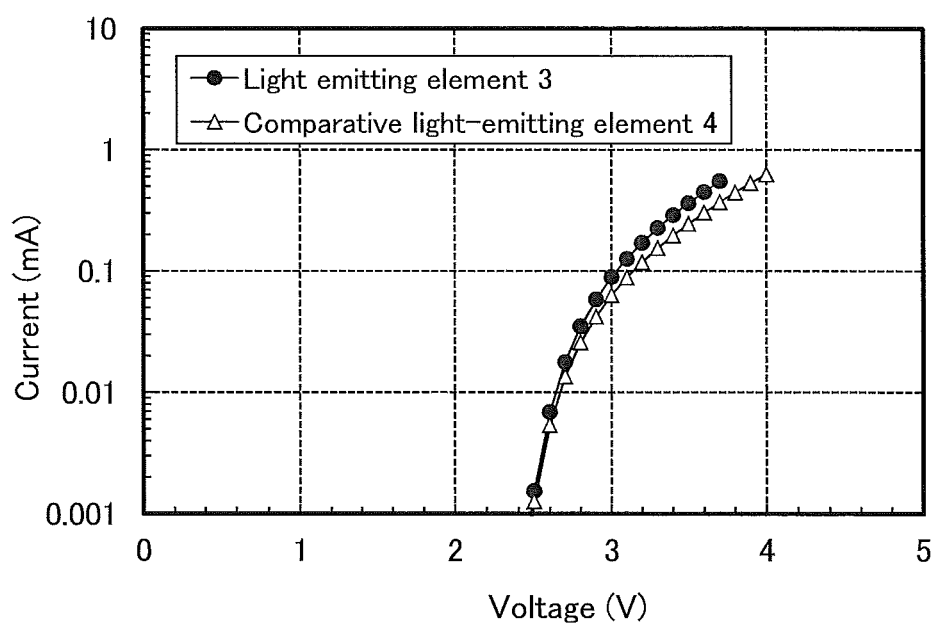
FIG. 15 is a graph showing voltage-current characteristics of a light-emitting element 3 and a comparative light-emitting element 4.
Figure 16:
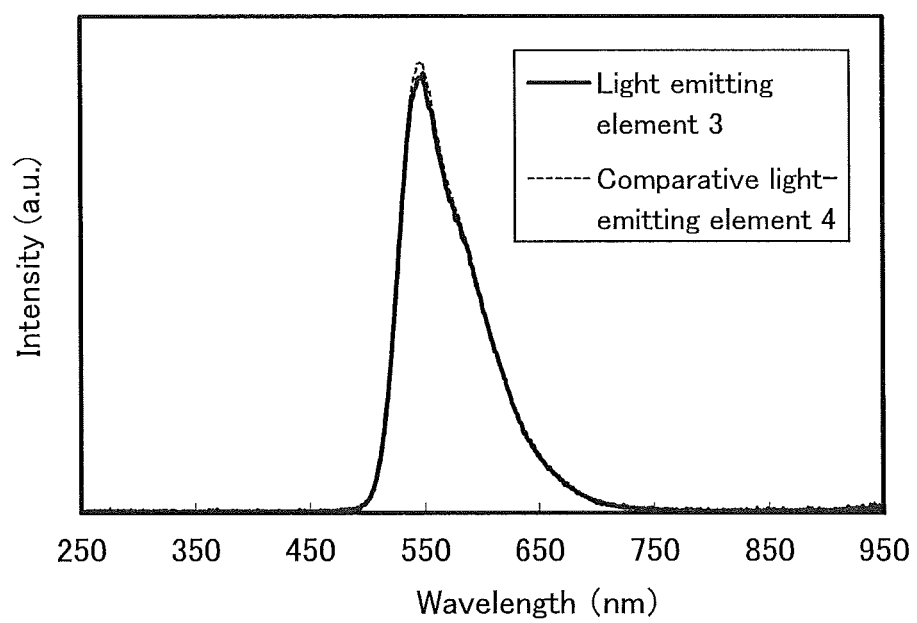
FIG. 16 is a graph showing emission spectra of a light-emitting element 3 and a comparative light-emitting element 4.

FIG. 7 shows current density-luminance characteristics of the light-emitting element 1 and the comparative light-emitting element 2, FIG. 8 shows voltage-luminance characteristics thereof, FIG. 9 shows luminance-current efficiency characteristics thereof, FIG. 10 shows voltage-current characteristics thereof, and FIG. 11 shows emission spectra thereof FIG. 12 shows current density-luminance characteristics of the light-emitting element 3 and the comparative light-emitting element 4, FIG. 13 shows voltage-luminance characteristics thereof, FIG. 14 shows luminance-current efficiency characteristics thereof, FIG. 15 shows voltage-current characteristics thereof, and FIG. 16 shows emission spectra thereof.

Figure 17:
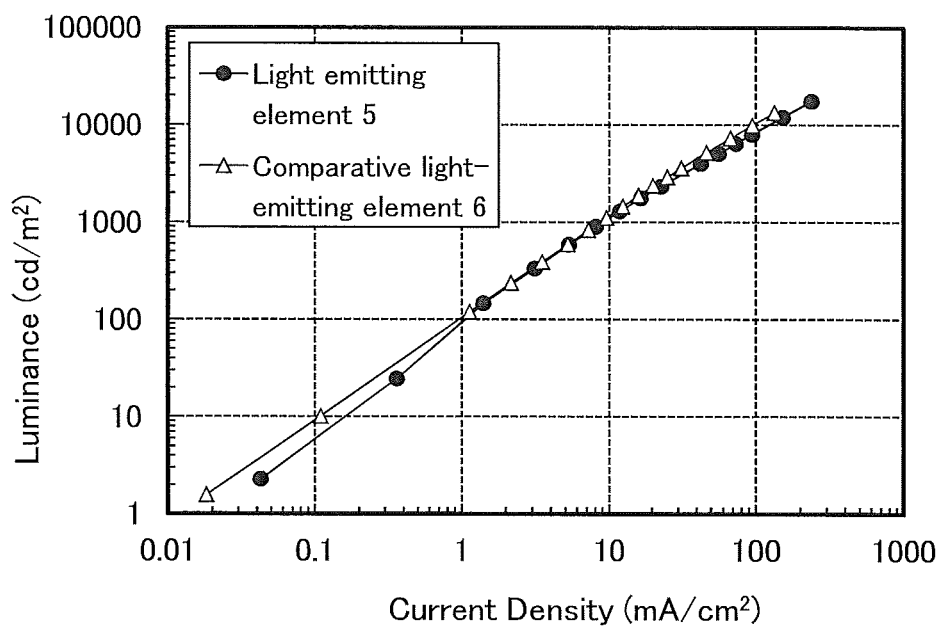
FIG. 17 is a graph showing current density-luminance characteristics of a light-emitting element 5 and a comparative light-emitting element 6.
Figure 18:
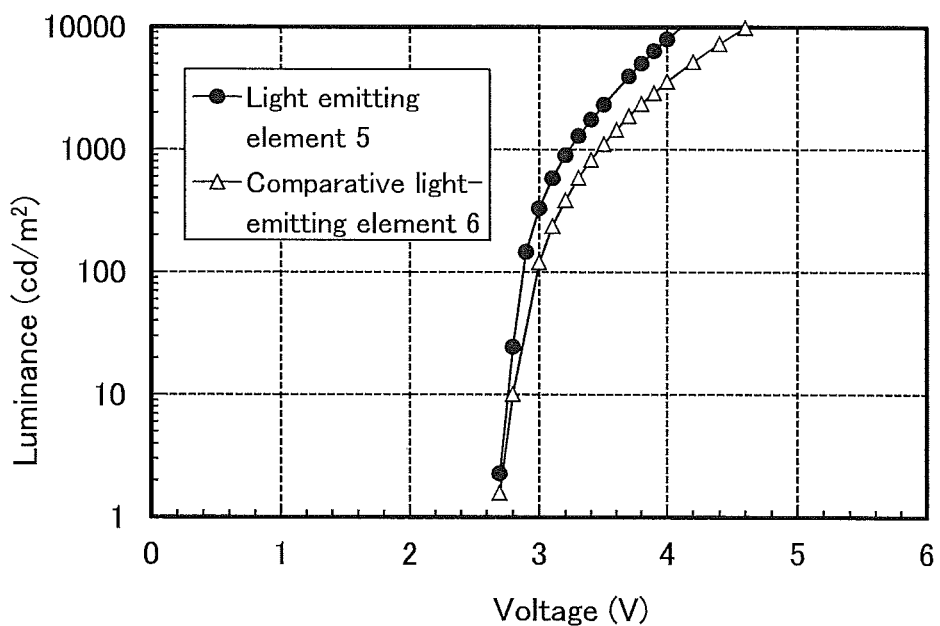
FIG. 18 is a graph showing voltage-luminance characteristics of a light-emitting element 5 and a comparative light-emitting element 6.
Figure 19:
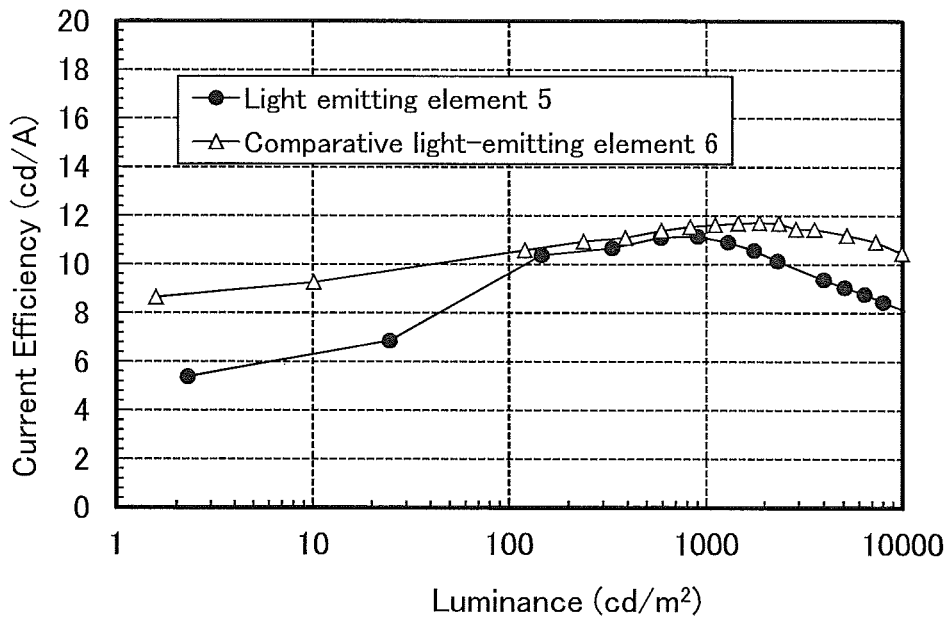
FIG. 19 is a graph showing luminance-current efficiency characteristics of a light-emitting element 5 and a comparative light-emitting element 6.
Figure 20:
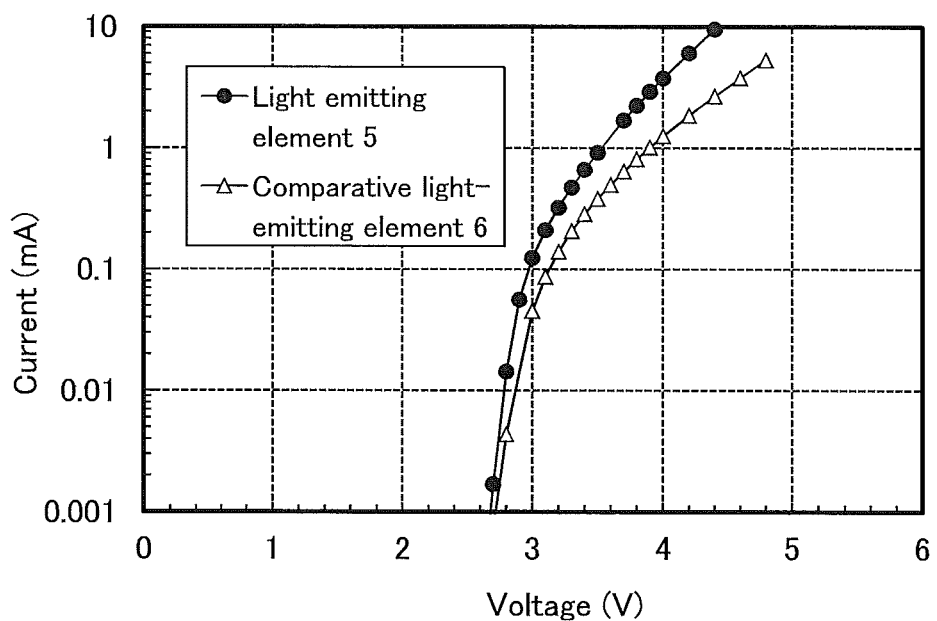
FIG. 20 is a graph showing voltage-current characteristics of a light-emitting element 5 and a comparative light-emitting element 6.
Figure 21:
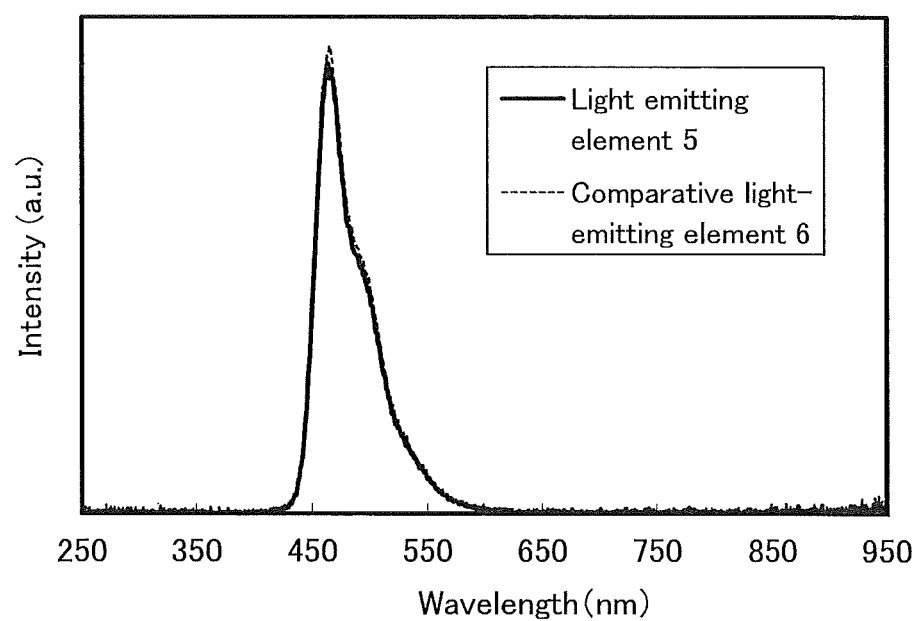
FIG. 21 is a graph showing emission spectra of a light-emitting element5 and a comparative light-emitting element 6.

FIG. 17 shows current density-luminance characteristics of the light-emitting element 5 and the comparative light-emitting element 6 FIG. 18 shows voltage-luminance characteristics thereof, FIG. 19 shows luminance-current efficiency characteristics thereof, FIG. 20 shows voltage-current characteristics thereof, and FIG. 21 shows emission spectra thereof.

In FIG. 7, FIG. 12, and FIG. 17, the horizontal axis represents current density (mA/cm$^2$), and the vertical axis represents luminance (cd/m$^2$). In FIG. 8, FIG. 13, and FIG. 18, the horizontal axis represents voltage (V), and the vertical axis represents luminance (cd/m$^2$). In FIG. 9, FIG. 14, and FIG. 19, the horizontal axis represents luminance (cd/m$^2$) and the vertical axis represents current efficiency (cd/A). In FIG. 10, FIG. 15, and FIG. 20, the horizontal axis represents voltage (V) and the vertical axis represents current (mA). In FIG. 11, FIG. 16, and FIG. 21, the horizontal axis represents wavelength (nm) and the vertical axis represents intensity (arbitrary unit). Note that the emission spectra of the light-emitting elements substantially overlap each other in FIG. 11, FIG. 16, and FIG. 21.

Table 3 shows the voltage (V), current density (mA/cm$^2$), CIE chromaticity coordinates (x, y), current efficiency (cd/

A), and external quantum efficiency (%) of each light-emitting element at a luminance of around 1000 cd/m².

TABLE 3

|  | Voltage (V) | Current density (mA/cm²) | chromaticity x | chromaticity y | Luminance (cd/m²) | Current efficiency (cd/A) | external quantum efficiency (%) | Note |
|---|---|---|---|---|---|---|---|---|
| Light-emitting element 1 | 3.2 | 3.6 | 0.66 | 0.34 | 992 | 27 | 24 | Red-light-emitting element |
| Comparative light-emitting element 2 | 3.3 | 4.0 | 0.66 | 0.34 | 1103 | 27 | 23 | Red-light-emitting element |
| Light-emitting element 3 | 2.8 | 0.9 | 0.43 | 0.56 | 804 | 91 | 26 | Green-light-emitting element |
| Comparative light-emitting element 4 | 2.9 | 1.1 | 0.43 | 0.56 | 987 | 93 | 26 | Green-light-emitting element |
| Light-emitting element 5 | 3.2 | 8.1 | 0.14 | 0.19 | 905 | 11 | 9 | Blue-light-emitting element |
| Comparative light-emitting element 6 | 3.5 | 9.6 | 0.14 | 0.19 | 1115 | 12 | 9 | Blue-light-emitting element |

As shown in Table 3, the light-emitting element 1 having a luminance of 992 cd/m² exhibited the following element characteristics: a current efficiency of 27 cd/A, an external quantum efficiency of 24%, CIE chromaticity coordinates (x, y) of (0.66, 0.34). Further the comparative light-emitting element 2 having a luminance of 1103 cd/m² exhibited the following element characteristics: a current efficiency of 27 cd/A, an external quantum efficiency of 23%, CIE chromaticity coordinates (x, y) of (0.66, 0.34).

Further, as shown in FIG. 11, the emission spectra of the light-emitting element 1 and the comparative light-emitting element 2 each have a peak at 619 nm.

As described above, the comparison between the light-emitting element 1 and the comparative light-emitting element 2 suggests that there is no difference in element characteristics therebetween. That is, the above results show that the electron-transport layer 1117 (CzPA) of the light-emitting element 1 and the electron-transport material (2mDBTBPDBq-II) serving as the host material of the phosphorescent material of the light-emitting element 1 each have a high electron-transport property, and thus the light-emitting element 1 has an element structure in which light emission excited in the light-emitting layer 1115 is not diffused or is hardly diffused to the electron-transport layer 1117 side.

As shown in Table 3, the light-emitting element 3 having a luminance of 804 cd/m² exhibited the following element characteristics: a current efficiency of 91 cd/A, an external quantum efficiency of 26%, CIE chromaticity coordinates (x, y) of (0.43, 0.56). Further the comparative light-emitting element 4 having a luminance of 987 cd/m² exhibited the following element characteristics: a current efficiency of 93 cd/A, an external quantum efficiency of 26%, CIE chromaticity coordinates (x, y) of (0.43, 0.56).

Further, as shown in FIG. 16, the emission spectra of the light-emitting element 3 and the comparative light-emitting element 4 have a peak at 549 nm and a peak at 546 nm, respectively.

As described above, the comparison between the light-emitting element 3 and the comparative light-emitting element 4 suggests that there is no difference in element characteristics therebetween. That is, the above results show that the electron-transport layer 1117 (CzPA) of the light-emitting element 3 and the electron-transport material (2mDBTBPDBq-II) serving as the host material of the phosphorescent material of the light-emitting element 3 each have a high electron-transport property, and thus the light-emitting element 3 has an element structure in which light emission excited in the light-emitting layer 1115 is not diffused or is hardly diffused to the electron-transport layer 1117 side.

As shown in Table 3, the light-emitting element 5 having a luminance of 905 cd/m² exhibited the following element characteristics: a current efficiency of 11 cd/A, an external quantum efficiency of 9%, CIE chromaticity coordinates (x, y) of (0.14, 0.19). Further the comparative light-emitting element 6 having a luminance of 1115 cd/m² exhibited the following element characteristics: a current efficiency of 12 cd/A, an external quantum efficiency of 9%, CIE chromaticity coordinates (x, y) of (0.14, 0.19).

Further, as shown in FIG. 21, the emission spectra of the light-emitting element 5 and the comparative light-emitting element 6 have a peak at 464 nm and a peak at 465 nm, respectively.

As described above, the comparison between the light-emitting element 5 and the comparative light-emitting element 6 suggests that there is a difference in element characteristics therebetween. Specifically, as shown in Table 3 and FIG. 20, they mainly differ in voltage-current characteristics. The light-emitting element 5 has a voltage of 3.3 V at 905 cd/m², and the comparative light-emitting element 6 has a voltage of 3.5 V at 1115 cd/m². Further, as shown in FIG. 20, when the voltage increases from around 3 V, the comparative light-emitting element 6 has a current value lower than that of the light-emitting element 5 of one embodiment of the present invention.

This is because the electron-transport layer 1117 of the comparative light-emitting element 6 includes the electron-transport material (2mDBTBPDBq-II) serving as the host material of the phosphorescent material. The host material of the phosphorescent material has a lower electron-transport property than the electron-transport material (CzPA) used for the light-emitting layer 1115.

On the other hand, in the light-emitting element 5 of one embodiment of the present invention, the electron-transport layer 1117 (CzPA) has a better electron-transport property than the electron-transport material (2mDBTBPDBq-II) serving as the host material of the phosphorescent material; therefore, the light-emitting element 5 has more favorable element characteristics with lower driving voltage.

Note that the structure described in this example can be combined as appropriate with any of the structures described in the embodiments or the other examples.

EXAMPLE 3

Figure 6B:
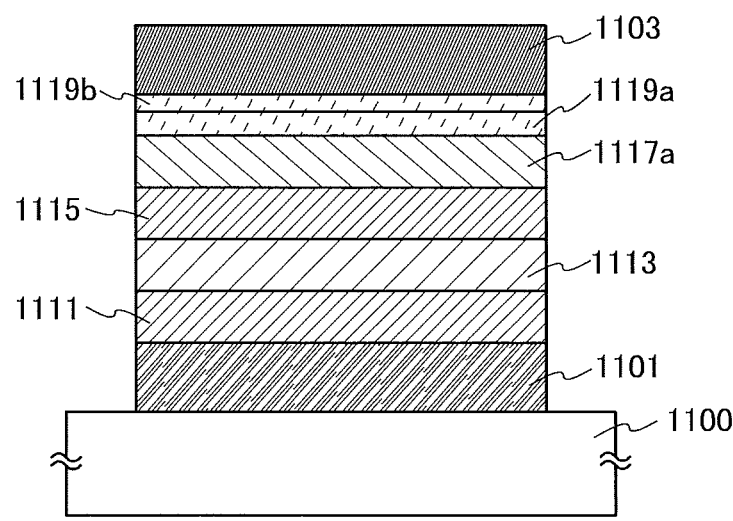

In this example, the light-emitting elements (the light-emitting elements 7 and 8) of one embodiment of the present invention are described with reference to FIG. 6B. Chemical formulae of materials used in this example are shown below.

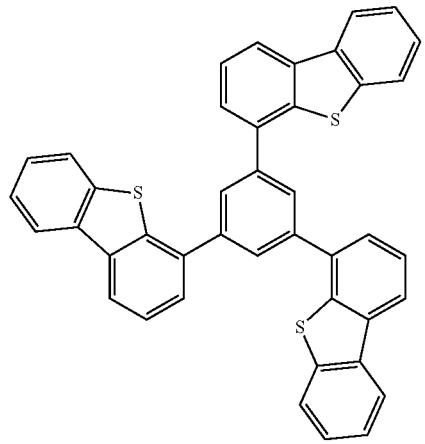

DBT3P-II

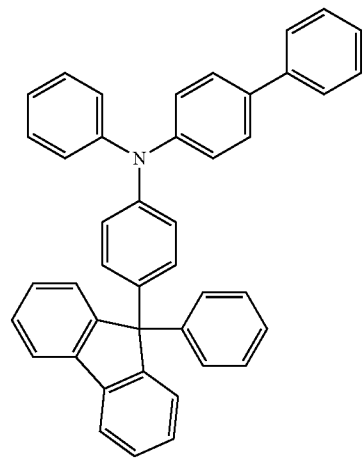

BPAFLP

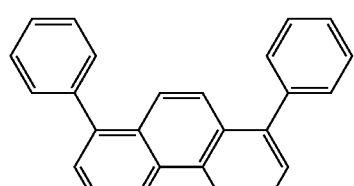

BPhen

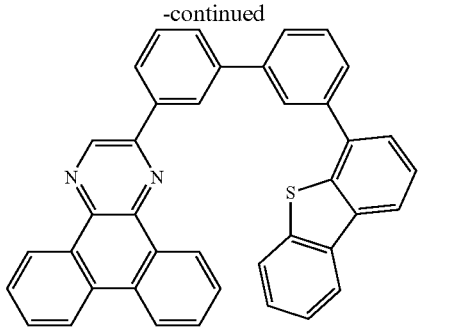

2mDBTBPDBq-II

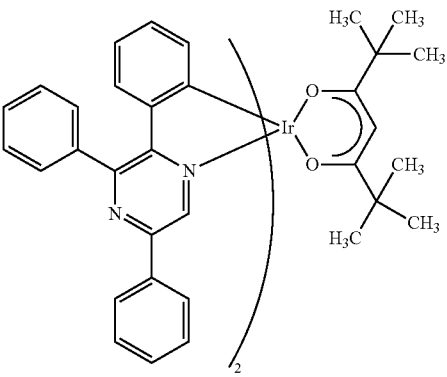

Ir(tppr)$_2$(dpm)

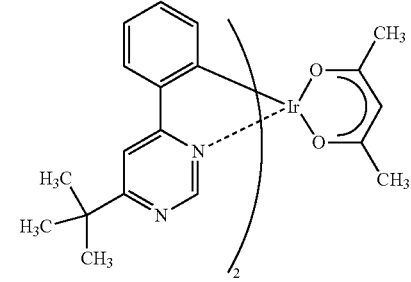

Ir(tBuppm)$_2$(acac)

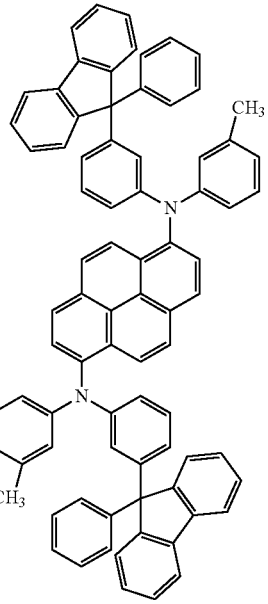

1,6mMemFLPAPrn

-continued

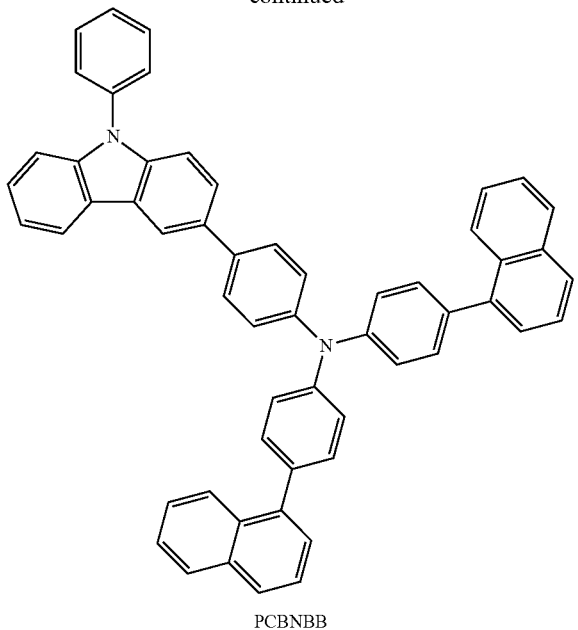

PCBNBB

Methods for manufacturing the light-emitting elements (the light-emitting elements 7 and 8) of one embodiment of the present invention, which are used in this example, are described below.

Note that the light-emitting element 7 is a red-light-emitting element, and the light-emitting element 8 is a green-light-emitting element.

(Light-Emitting Element 7)

First, over the substrate 1100, an indium oxide-tin oxide compound containing silicon or silicon oxide (ITSO) was deposited by a sputtering method, so that the anode 1101 was formed. Note that the composition ratio of $In_2O_3$ to $SnO_2$ and $SiO_2$ in the target used was 85:10:5 [wt %]. The thickness of the anode 1101 was 110 nm and the electrode area was 2 mm×2 mm.

Next, as pretreatment for forming the light-emitting element over the substrate 1100, the surface of the substrate was washed, baked at 200° C. for one hour, and subjected to UV ozone treatment for 370 seconds.

After that, the substrate 1100 was transferred into a vacuum evaporation apparatus where the pressure had been reduced to approximately $10^{-4}$ Pa, and subjected to vacuum baking at 170° C. for 30 minutes in a heating chamber of the vacuum evaporation apparatus, and then the substrate 1100 was cooled down for about 30 minutes.

Then, the substrate 1100 over which the anode 1101 was formed was fixed to a substrate holder provided in a vacuum evaporation apparatus so that the surface on which the anode 1101 was formed faced downward. The pressure in the vacuum evaporation apparatus was reduced to about $10^{-4}$ Pa. After that, on the anode 1101, by an evaporation method using resistance heating, 4,4',4''-(benzene-1,3,5-triyl)tri (dibenzothiophene) (abbreviation: DBT3P-II) and molybdenum oxide were deposited by co-evaporation, whereby the hole-injection layer 1111 was formed. The thickness was set to 40 nm, and the weight ratio of DBT3P-II to molybdenum oxide was adjusted to 4:2 (=DBT3P-II:molybdenum oxide).

Next, 4-phenyl-4'-(9-phenylfluoren-9-yl)triphenylamine (abbreviation: BPAFLP) was deposited to a thickness of 20 nm over the hole-injection layer 1111, whereby the hole-transport layer 1113 was formed.

Next, 2mDBTBPDBq-II, 4,4'-di(1-naphthyl)-4''-(9-phenyl-9H-carbazol-3-yl)-triphenylamine (abbreviation: PCBNBB), and (dipivaloyhnethanato)bis(2,3,5-triphenylpyrazinato)iridium(III) (abbreviation: Ir(tppr)$_2$(dpm)) were co-evaporated to form a light-emitting layer 1115 over the hole-transport layer 1113. Here, the weight ratio of 2mDBTBPDBq-II, PCBNBB, and Ir(tppr)$_2$(dpm) was adjusted to 0.8:0.2:0.06 (=2mDBTBPDBq-II:PCBNBB:Ir(tppr)$_2$(dpm)). The thickness of the light-emitting layer 1115 was 40 nm.

In the light-emitting layer 1115, 2mDBTBPDBq-II, which is an electron-transport material, functions as a host material. Further, PCBNBB, which is a hole-transport material, functions as an assist material. Furthermore, Ir(tppr)$_2$(dpm), which is an organometallic complex containing iridium, functions as a guest material.

Further, CzPA and 1,6mMemFLPAPrn were co-evaporated over the light-emitting layer 1115, whereby an electron-transport layer 1117a was formed over the light-emitting layer 1115. Here, the weight ratio of CzPA to 1,6mMemFLPAPrn was adjusted to 1:0.05 (=CzPA:1,6mMemFLPAPrn). The thickness of the electron-transport layer 1117a of the light-emitting element 7 was 25 nm.

Note that the electron-transport layer 1117a of the light-emitting element 7 has the same structure as the light-emitting layers of the light-emitting element 5 and the comparative light-emitting element 6 described in Example 2. That is, a blue-light-emitting layer is used as the electron-transport layer 1117a of the light-emitting element 7.

After that, on the electron-transport layer 1117, bathophenanthroline (abbreviation: BPhen) was deposited to a thickness of 15 nm to form the first electron-injection layer 1119a.

Further, lithium fluoride (LiF) was evaporated to a thickness of 1 nm on the first electron-injection layer 1119a, so that the second electron-injection layer 1119b was formed.

Lastly, on the second electron-injection layer 1119b, aluminum was evaporated to a thickness of 200 nm as the cathode 1103. Thus, the light-emitting element 7 of this example was formed.

(Light-Emitting Element 8)

The light-emitting element 8 is different from the light-emitting element 7 in the light-emitting layer 1115. Specifically, instead of 2mDBTBPDBq-II, PCBNBB, and Ir(tppr)$_2$(dpm), which were used for the light-emitting element 7, 2mDBTBPDBq-II, PCBNBB, and Ir(tBuppm)$_2$(acac) were used for the light-emitting layer 1115 of the light-emitting element 8.

The light-emitting layer 1115 of the light-emitting element 8 was formed over the hole-transport layer 1113 by co-evaporation of 2mDBTBPDBq-II, PCBNBB, and Ir(tBuppm)$_2$(acac). Here, the weight ratio of 2mDBTBP-DBq-II, PCBNBB and Ir(tBuppm)$_2$(acac) was adjusted to 0.8:0.2:0.06 (=2mDBTBPDBq-II:PCBNBB: Ir(tBuppm)$_2$(acac)). The thickness of the light-emitting layer 1115 of the light-emitting element 8 was 40 nm.

In the light-emitting layer 1115 of the light-emitting element 8, 2mDBTBPDBq-II, which is an electron-transport material, functions as a host material. Further, PCBNBB, which is a hole-transport material, functions as an assist material. Furthermore, Ir(tBuppm)$_2$(acac), which is an organometallic complex containing iridium, functions as a guest material.

The electron-transport layer 1117a of the light-emitting element 8 has the same structure as the light-emitting layers of the light-emitting element 5 and the comparative light-emitting element 6 described in Example 2 in a manner similar to that of the light-emitting element 7. That is, a blue-light-emitting layer is used for the electron-transport layer 1117a of the light-emitting element 8.

The components of the light-emitting element 8 other than the light-emitting layer 1115 were formed in a manner similar to those of the light-emitting element 7.

The evaporation process of each of the light-emitting elements (the light-emitting elements 7 and 8) of one embodiment of the present invention is performed by a resistance-heating method.

Table 4 shows element structures of the thus obtained light-emitting elements (the light-emitting elements 7 and 8).

As shown in Table 5, the light-emitting element 7 having a luminance of 984 cd/m$^2$ exhibited the following element characteristics: a current efficiency of 27 cd/A, an external

TABLE 4

| | Anode | Hole-injection layer | Hole-transport layer | Light-emitting layer | Electron-transport layer | First electron-injection layer | Second electron-injection layer | Cathode | Note |
|---|---|---|---|---|---|---|---|---|---|
| Light-emitting element 7 | ITSO 110 nm | DBT3P-II:MoO$_x$ (=4:2) 40 nm | BPAFLP 20 nm | See below | See below | BPhen 15 nm | LiF 1 nm | Al 200 nm | Red-light-emitting element |
| Light-emitting element 8 | ITSO 110 nm | DBT3P-II:MoO$_x$ (=4:2) 40 nm | BPAFLP 20 nm | See below | See below | BPhen 15 nm | LiF 1 nm | Al 200 nm | Green-light-emitting element |
| Light-emitting element 7 | | | | 2mDBTBPDBq-II:PCBNBB:Ir(tppr)$_2$dpm (=0.8:0.2:0.06) 40 nm | | CzPA:1,6mMemFLPAPm (=1:0.05) 25 nm | | | |
| Light-emitting element 8 | | | | 2mDBTBPDBq-II:PCBNBB:Ir(tBuppm)$_2$(acac) (=0.8:0.2:0.06) 40 nm | | CzPA:1,6mMemFLPAPm (=1:0.05) 25 nm | | | |

As shown in Table 4, as for the light-emitting elements of one embodiment of the present invention, 2mDBTBPDBq-II is used as host materials of phosphorescent materials (of the light-emitting elements 7 and 8). Moreover, the same CzPA and 1,6mMemFLPAPrn are used for the electron-transport layers of the light-emitting elements 7 and 8.

Next, in a glove box containing a nitrogen atmosphere, the light-emitting elements formed as described above were sealed with a glass substrate so as not to be exposed to the air (specifically, a sealant was applied onto an outer edge of the element and heat treatment was performed at 80° C. for one hour at the time of sealing). Then, the operation characteristics of the light-emitting elements were measured. It is to be noted that the measurements were performed at room temperature (in an atmosphere kept at 25° C.).

Figure 22:
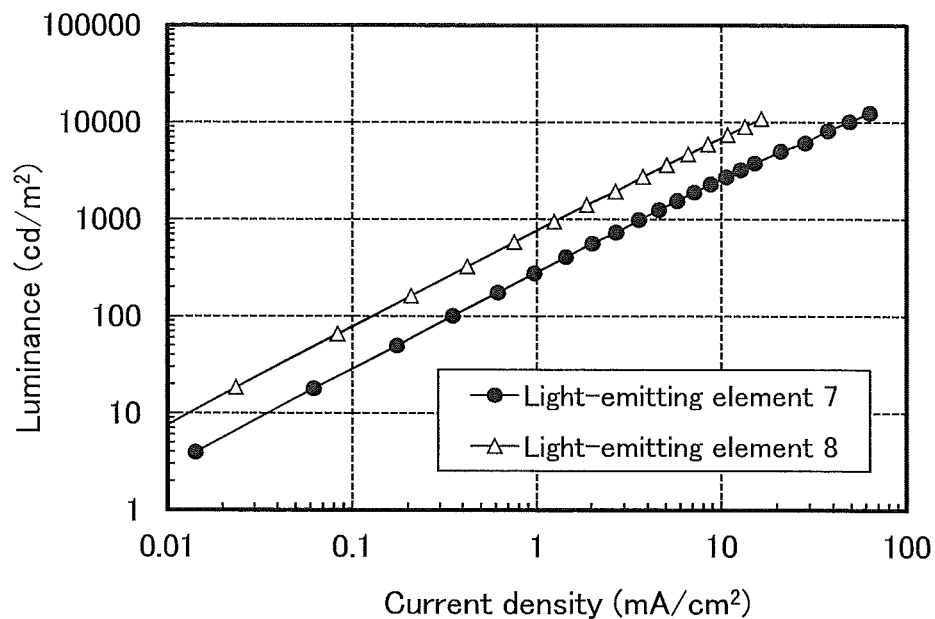
FIG. 22 is a graph showing current density-luminance characteristics of light-emitting elements 7 and 8.
Figure 23:
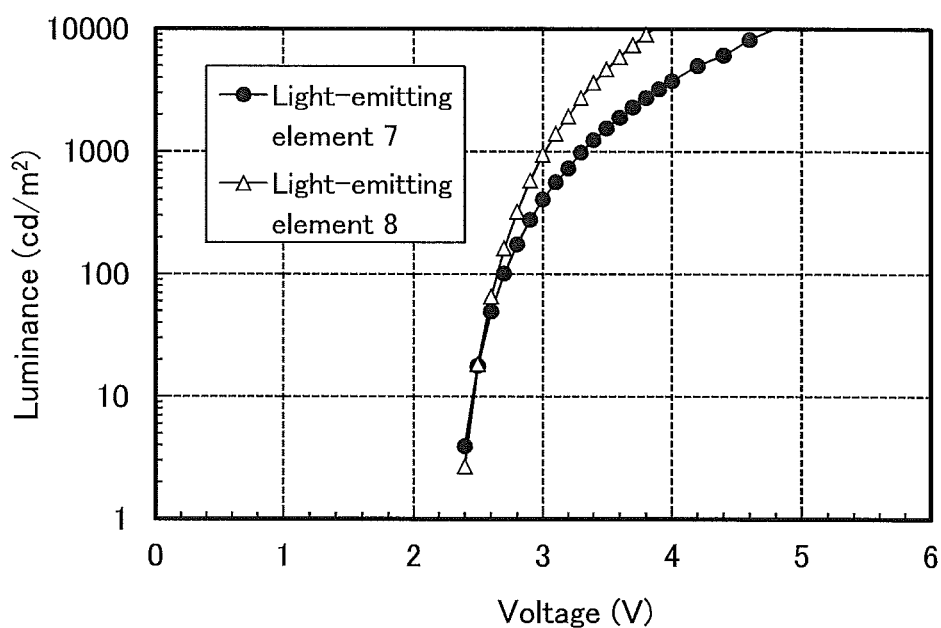
FIG. 23 is a graph showing voltage-luminance characteristics of light-emitting elements 7 and 8.
Figure 24:
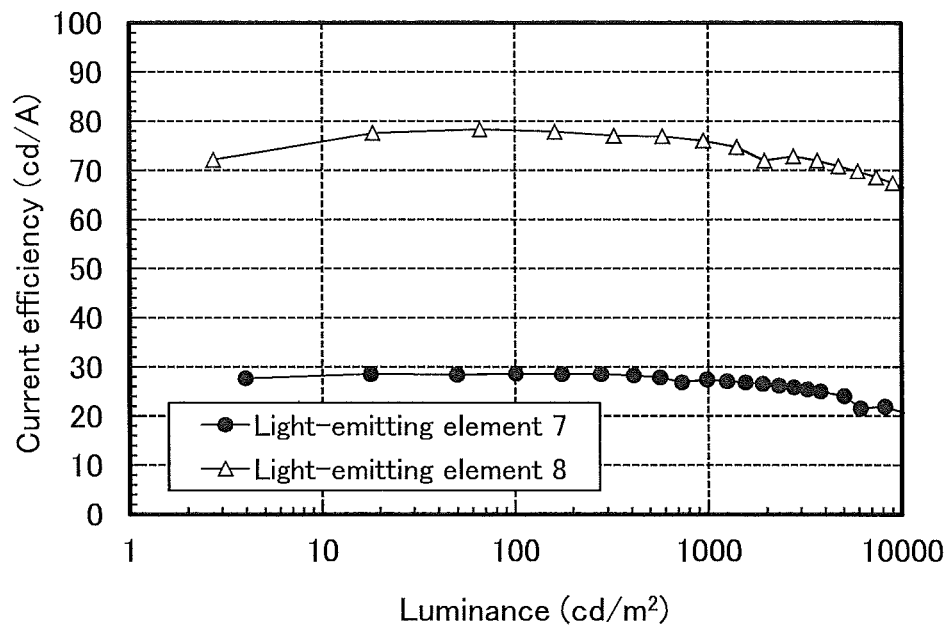
FIG. 24 is a graph showing luminance-current efficiency characteristics of light-emitting elements 7 and 8.
Figure 25:
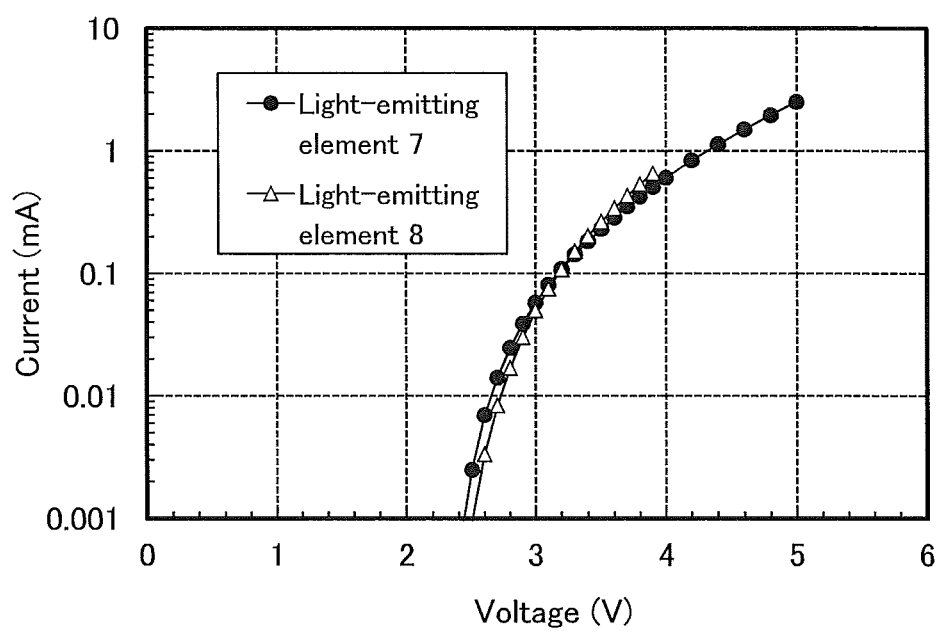
FIG. 25 is a graph showing voltage-current characteristics of light-emitting elements 7 and 8.
Figure 26:
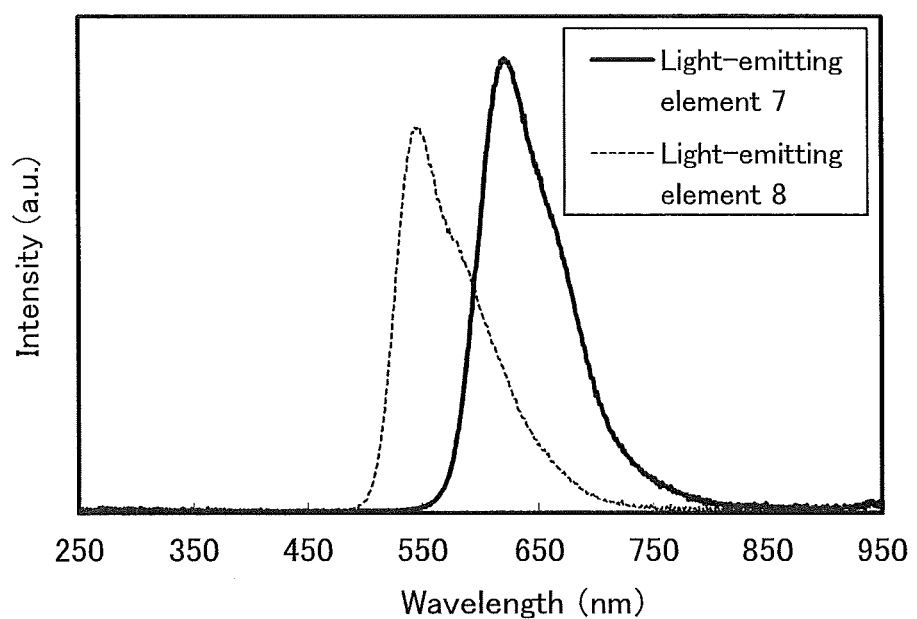
FIG. 26 is a graph showing emission spectra of light-emitting elements 7 and 8.

FIG. 22 shows current density-luminance characteristics of the light-emitting elements 7 and 8, FIG. 23 shows voltage-luminance characteristics thereof, FIG. 24 shows luminance-current efficiency characteristics thereof, FIG. 25 shows voltage-current characteristics thereof, and FIG. 26 shows emission spectra thereof.

In FIG. 22, the horizontal axis represents current density (mA/cm$^2$), and the vertical axis represents luminance (cd/m$^2$). In FIG. 23, the horizontal axis represents voltage (V), and the vertical axis represents luminance (cd/m$^2$). In FIG. 24, the horizontal axis represents luminance (cd/m$^2$) and the vertical axis represents current efficiency (cd/A). In FIG. 25, the horizontal axis represents voltage (V) and the vertical axis represents current (mA). In FIG. 26, the horizontal axis represents wavelength (nm) and the vertical axis represents intensity (arbitrary unit).

Further, Table 5 shows the voltage (V), current density (mA/cm$^2$), CIE chromaticity coordinates (x, y), current efficiency (cd/A), and external quantum efficiency (%) of each light-emitting element at a luminance of around 1000 cd/m$^2$.

quantum efficiency of 25%, CIE chromaticity coordinates (x, y) of (0.66, 0.34). Further the light-emitting element 8 having a luminance of 948 cd/m$^2$ exhibited the following element characteristics: a current efficiency of 76 cd/A, an external quantum efficiency of 23%, CIE chromaticity coordinates (x, y) of (0.44, 0.56).

As shown in FIG. 26, the emission spectrum of the light-emitting element 7 has a peak at 620 nm and the light-emitting element 8 has a peak at 548 nm. Further, FIG. 26 shows that blue light emission from 1,6mMeinFLPAPrn used in the electron-transport layer (see FIG. 21) is not observed.

As described above, the element characteristics equivalent to those of the light emitting element 1 described in Example 2 can be obtained in the light-emitting element 7 of one embodiment of the present invention even when a blue-light-emitting layer is used as the electron-transport layer 1117*a*. Further, the element characteristics equivalent to those of the light emitting element 3 described in Example 2 can be obtained in the light-emitting element 8 of one embodiment of the present invention even when a blue-light-emitting layer is used as the electron-transport layer 1117*a*.

Therefore, since the host material (CzPA) of the fluorescent material used for the electron-transport layer 1117*a* and the electron-transport material (2mDBTBPDBq-II) serving as the host material of the phosphorescent material each have a high electron-transport property, the light-emission region of the light-emitting element is formed in the light-emitting layer 1115 in the vicinity of the hole-transport layer 1113, and light emission excited in the light-emitting layer 1115 is not diffused or is hardly diffused to the electron-transport layer 1117*a* side. The electron-transport layer 1117*a* used in the light-emitting elements 7 and 8 includes

TABLE 5

| | Voltage (V) | Current density (mA/cm$^2$) | chromaticity x | chromaticity y | Luminance (cd/m$^2$) | Current efficiency (cd/A) | external quantum efficiency (%) | Note |
|---|---|---|---|---|---|---|---|---|
| Light-emitting element 7 | 3.3 | 3.6 | 0.66 | 0.34 | 984 | 27 | 25 | Red-light-emitting element |
| Light-emitting element 8 | 3.0 | 1.2 | 0.44 | 0.56 | 948 | 76 | 23 | Green-light-emitting element |

1,6mMemFLPAPrn, which is a fluorescent material. However, as shown in FIGS. 22 to 26, 1,6mMemFLPAPrn, which is a fluorescent material, does not affect the element characteristics.

Note that the structure described in this example can be combined as appropriate with any of the structures described in the embodiments or the other examples.

EXAMPLE 4

In this example, the light-emitting elements 1, 3, 7, and 8, which are the light-emitting elements of one embodiment of the present invention and formed in Examples 2 and 3, and the comparative light-emitting elements 2 and 4, which are light-emitting elements for comparison and formed in Examples 2 and 3, are subjected to reliability tests. The results of the reliability tests are shown in FIGS. 27A and 27B.

Figure 27A:
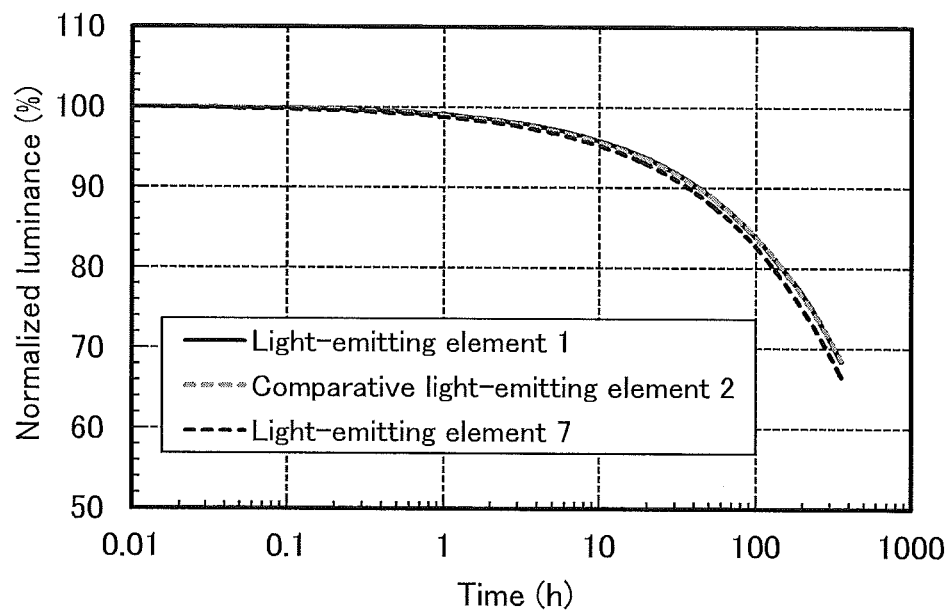
FIG. 27A is a graph showing results of reliability tests of light-emitting elements 1 and 7 , and a comparative light-emitting element 2.
Figure 27B:
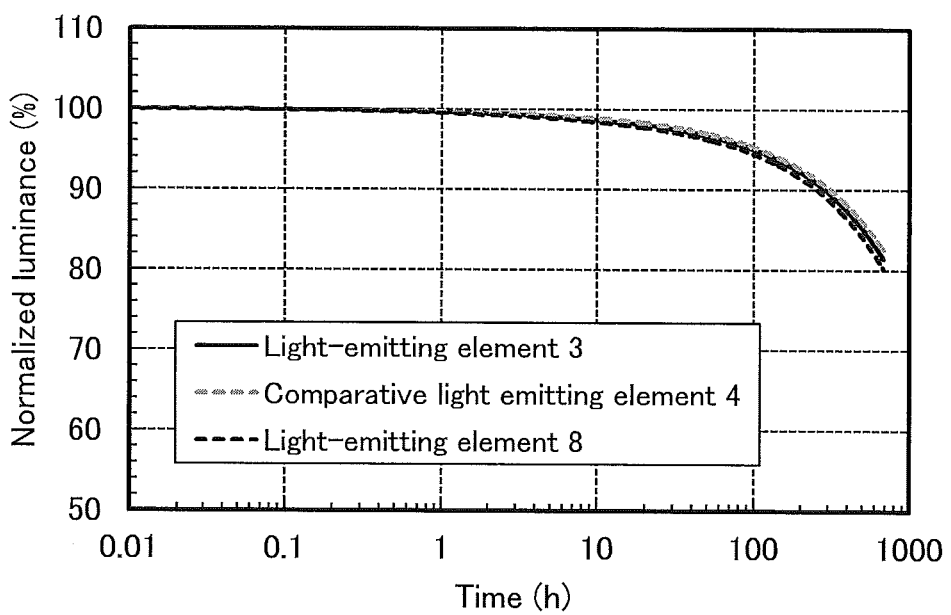
FIG. 27B is a graph showing results of reliability tests of light-emitting elements 3 and 8, and a comparative light-emitting element 4.

FIG. 27A shows the results of reliability tests of the light-emitting element 1, the comparative light-emitting element 2, and the light-emitting element 7, i.e., red-light-emitting elements. FIG. 27B shows the results of reliability tests of the light-emitting element 3, the comparative light-emitting element 4, and the light-emitting element 8, i.e., green-light-emitting elements. In the reliability test, each light-emitting element was driven under the conditions where the initial luminance was 5000 $cd/m^2$ and the current density was constant. The results are shown in FIGS. 27A and 27B. The horizontal axis represents driving time (h) of the element and the vertical axis represents normalized luminance (%) on the assumption that the initial luminance is 100%. In FIGS. 27A and 27B, data of the light-emitting elements substantially overlap with each other.

The results of FIG. 27A show that normalized luminance of the light-emitting element 1 obtained after 357 hours was 68%. Further, normalized luminance of the comparative light-emitting element 2 obtained after 357 hours was 68%. Furthermore, normalized luminance of the light-emitting element 7 obtained after 357 hours was 66%. FIG. 27B shows that normalized luminance of the light-emitting element 3 obtained after 688 hours was 81%. Further, normalized luminance of the comparative light-emitting element 4 obtained after 688 hours was 82%. Furthermore, normalized luminance of the light-emitting element 8 obtained after 688 hours was 80%.

As described above, the results of the reliability tests of the light-emitting elements 1 and 7 that are embodiments of the present invention are equivalent to the result of the reliability test of the comparative light-emitting element 2. Further, the results of the reliability tests of the light-emitting elements 3 and 8 that are embodiments of the present invention are equivalent to the result of the reliability test of the comparative light-emitting element 4.

Note that the structure described in this example can be combined as appropriate with any of the structures described in the embodiments or the other examples.

This application is based on Japanese Patent Application serial No. 2013-065394 filed with Japan Patent Office on Mar. 27, 2013, the entire contents of which are hereby incorporated by reference.

What is claimed is:

1. A light-emitting element comprising:
a cathode;
an anode; and
a first and a second light-emitting layer between the cathode and the anode,
wherein the first light-emitting layer comprises a first phosphorescent material and a first electron-transport material,
wherein the second light-emitting layer comprises a fluorescent material and a second electron-transport material,
wherein the first and the second light-emitting layers are each in contact with an electron-transport layer positioned on a cathode side,
wherein the electron-transport layer comprises a third electron-transport material,
wherein the third electron-transport material includes an anthracene structure,
and
wherein a triplet excitation energy of the third electron-transport material included in the electron-transport layer is lower than a triplet excitation energy of the first electron-transport material.

2. The light-emitting element according to claim 1, further comprising a third light-emitting layer between the cathode and the anode,
wherein the third light-emitting layer comprises a second phosphorescent material and a fourth electron-transport material,
wherein the third light-emitting layer is in contact with the electron-transport layer positioned on the cathode side, and
wherein the triplet excitation energy of the third electron-transport material included in the electron-transport layer is lower than a triplet excitation energy of the fourth electron-transport material.

3. The light-emitting element according to claim 2,
wherein the third light-emitting layer further comprises a second hole-transport material, and
wherein the third electron-transport material and the second hole-transport material form an exciplex.

4. The light-emitting element according to claim 2, wherein the second phosphorescent material is an organometallic complex containing iridium.

5. The light-emitting element according to claim 1, wherein the third electron-transport material is a same material as the second electron-transport material, and
wherein the electron-transport layer comprises the fluorescent material.

6. The light-emitting element according to claim 1,
wherein the first light-emitting layer further comprises a first hole-transport material, and
wherein the first electron-transport material and the first hole-transport material form an exciplex.

7. The light-emitting element according to claim 1, wherein the first phosphorescent material is an organometallic complex containing iridium.

8. The light-emitting element according to claim 1,
wherein the first light-emitting layer emits red or green light, and
wherein the second light-emitting layer emits blue light.

9. A light-emitting device comprising the light-emitting element according to claim 1.

10. An electronic appliance comprising the light-emitting device according to claim 9.

11. A lighting device comprising the light-emitting device according to claim 9.

12. The light-emitting element according to claim 1, further comprising:
a first hole-transport layer between the first light-emitting layer and the anode; and a second hole-transport layer between the second light-emitting layer and the anode,
wherein a thickness of the first hole-transport layer is greater than a thickness of the second hole-transport layer.

13. The light-emitting element according to claim 1 wherein an electron- transport property of the first electron-transport material is higher than an electron-transport property of the third electron-transport material.

* * * * *